(12) United States Patent
Scheffler et al.

(10) Patent No.: US 7,112,965 B2
(45) Date of Patent: Sep. 26, 2006

(54) LOW-IMPACT NOISE ACQUISITION MAGNETIC RESONANCE IMAGING

(75) Inventors: Klaus Scheffler, Basel (CH); Erich Seifritz, Binningen (CH)

(73) Assignee: University of Basel, Basel (CH)

( * ) Notice: Subject to any disclaimer, the term of this patent is extended or adjusted under 35 U.S.C. 154(b) by 8 days.

(21) Appl. No.: 10/835,207

(22) Filed: Apr. 30, 2004

(65) Prior Publication Data

US 2005/0242810 A1 Nov. 3, 2005

(51) Int. Cl.
*G01V 3/00* (2006.01)

(52) U.S. Cl. ..................................... 324/309
(58) Field of Classification Search ................ 324/307, 324/309
See application file for complete search history.

(56) References Cited

U.S. PATENT DOCUMENTS

| | | | | |
|---|---|---|---|---|
| 4,698,591 | A * | 10/1987 | Glover et al. | 324/307 |
| 5,833,610 | A | 11/1998 | Yokawa et al. | |
| 6,236,204 | B1 * | 5/2001 | Heid | 324/309 |
| 6,320,380 | B1 | 11/2001 | Wu et al. | |
| 6,329,821 | B1 * | 12/2001 | Zhou | 324/318 |
| 6,366,091 | B1 | 4/2002 | Takahashi et al. | |
| 6,380,738 | B1 * | 4/2002 | Zhou | 324/309 |
| 6,539,246 | B1 | 3/2003 | Heid | |
| 6,618,607 | B1 | 9/2003 | Song | |
| 6,700,374 | B1 | 3/2004 | Wu et al. | |

OTHER PUBLICATIONS

A. Mazard et al., Impact of FMRI Acoustic Noise on the Functional Anatomy of Visual Mental Imagery, J. Cogn. Neurosci., 14:2, 2002, pp. 172-186.

S. Ogawa et al., Intrinsic Signal Changes Accompanying Sensory Stimulation: Functional Brain Mapping With Magnetic Resonance Imaging, Proc. Natl. Acad. Sci., vol. 89, 1992, pp. 5951-5955.

D.S. Sabsevitz et al., Use of Preoperative Functional Neuroimaging to Predict Language Deficits from Epilepsy Surgery, Neurology, vol. 60, 2003, pp. 1788-1792.

E. Seifritz et al., Spatiotemporal Pattern of Neural Processing in the Human Auditory Cortex, Science, vol. 297, 2002, pp. 1706-1708.

Supporting Online Material for Seifritz (RE 1074355), downloaded from www.sciencemag.org/cgi/content/full/297/5587/1706/DC1, 5 pages.

N.J. Shah et al., The Effect of Sequence Repeat Time on Auditory Cortex Stimulation During Phonetic Discrimination, NeuroImage, vol. 12, 2000, pp. 100-108.

D.A. Hall et al., "Sparse" Temporal Sampling in Auditory fMRI, Hum. Brain Mapping, vol. 7, 1999, pp. 213-223.

W. B. Edminster et al., Improved Auditory Cortex Imaging using Clustered Volume Acquisitions, Hum. Brain Mapping, vol. 7, 1999, pp. 89-97.

(Continued)

*Primary Examiner*—Diego Gutierrez
*Assistant Examiner*—Dixomara Vargas
(74) *Attorney, Agent, or Firm*—Griffin & Szipl, P.C.

(57) ABSTRACT

A nuclear magnetic resonance imaging method that utilizes a LINA-EPI gradient pulse sequence, comprising the steps of: generating a LINA-EPI gradient pulse sequence comprising a read gradient, a RF excitation pulse, a slice gradient, and a phase encoding gradient; generating substantially monotonous gradient noise as a result of generating the LINA-EPI gradient pulse sequence, wherein the substantially monotonous gradient noise is substantially without banking and minimizes confounding BOLD effects during imaging; and imaging a test subject using the LINA-EPI gradient pulse sequence.

24 Claims, 24 Drawing Sheets

OTHER PUBLICATIONS

C.K. Chen et al., Active Cancelation System of Acuoustic Noise in MR Imaging, IEEE Trans. Biomed. Eng., vol. 46, No. 2, 1999, pp. 186-191.

Z. Cho et al., Effects of the Acoustic Noise of the Gradient Systems on fMRI: A Study on Auditory, Motor, and Visual Cortices, Mag. Reson. Med., vol. 39, 1998, pp. 331-335.

R.A. Hadeen and W. A. Edelstein, Characterization and Prediction of Gradient Acoustic Noise in MR Imagers, Mag. Reson. Med., vol. 37, 1997, pp. 7-10.

P.M. Jakob et al., Functional Burst Imaging, Mag. Reson. Med., vol. 40, 1998, pp. 614-621.

M.E. Ravicz, Acoustic Noise During Functional Magnetic Resonance Imaging, J. Acoust. Soc. Am., vol. 108, no. 4, 2000, pp. 1683-1696.

J. Henning and M. Hodapp, Burst Imaging, MAGMA, vol. 1, 1993, pp. 39-48.

T.Loenneker et al., Silent BOLD Imaging, MAGMA, vol. 13, 2001, pp. 76-81.

* cited by examiner

| FIG.3a | FIG.3b |
| --- | --- |
| FIG.3c | FIG.3d |
| FIG.3e | FIG.3f |

FIG.3

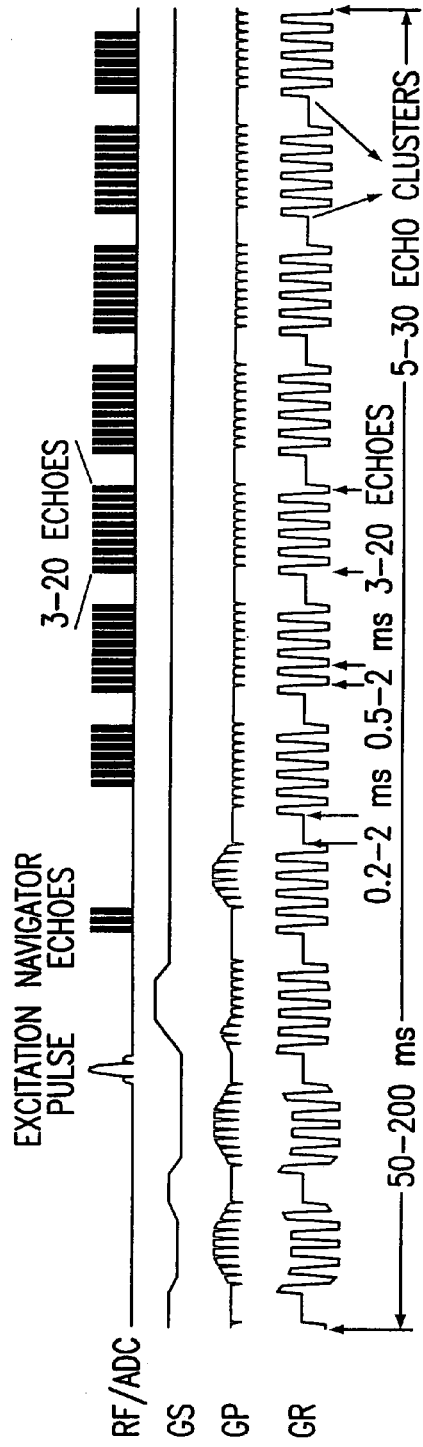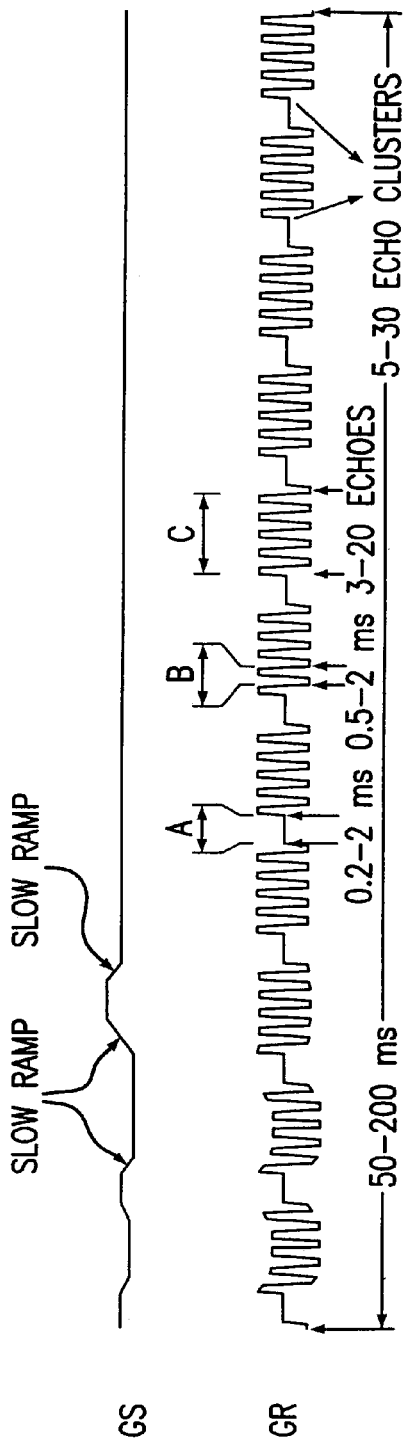

| FIG.7a | FIG.7b |
|--------|--------|
| FIG.7c | FIG.7d |
| FIG.7e | FIG.7f |

FIG.7

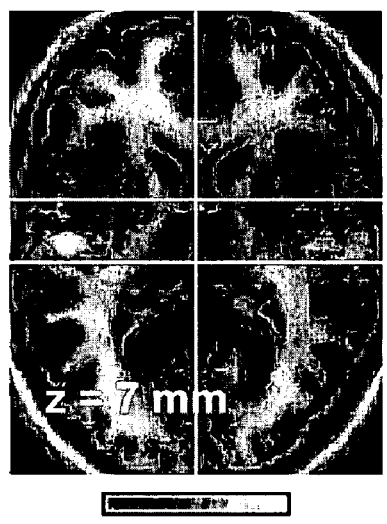
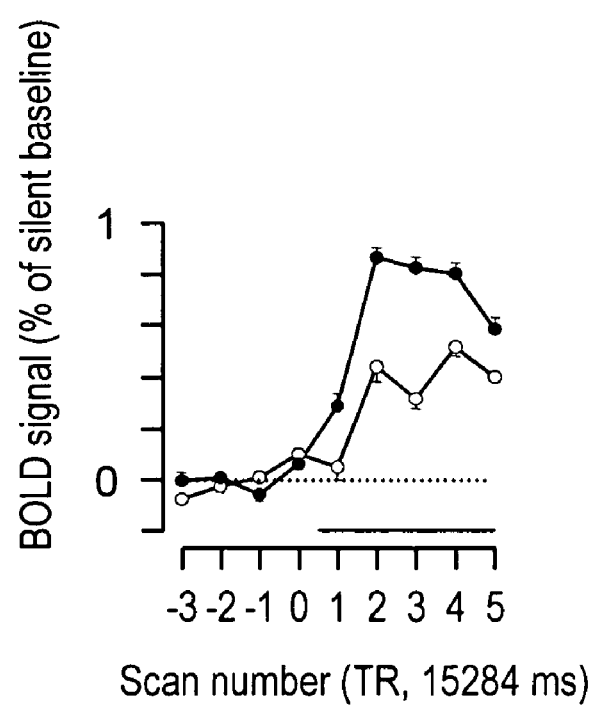
$4.71 \leq t_{984} \leq 5.71$
Scan number (TR, 15284 ms)
FIG.9

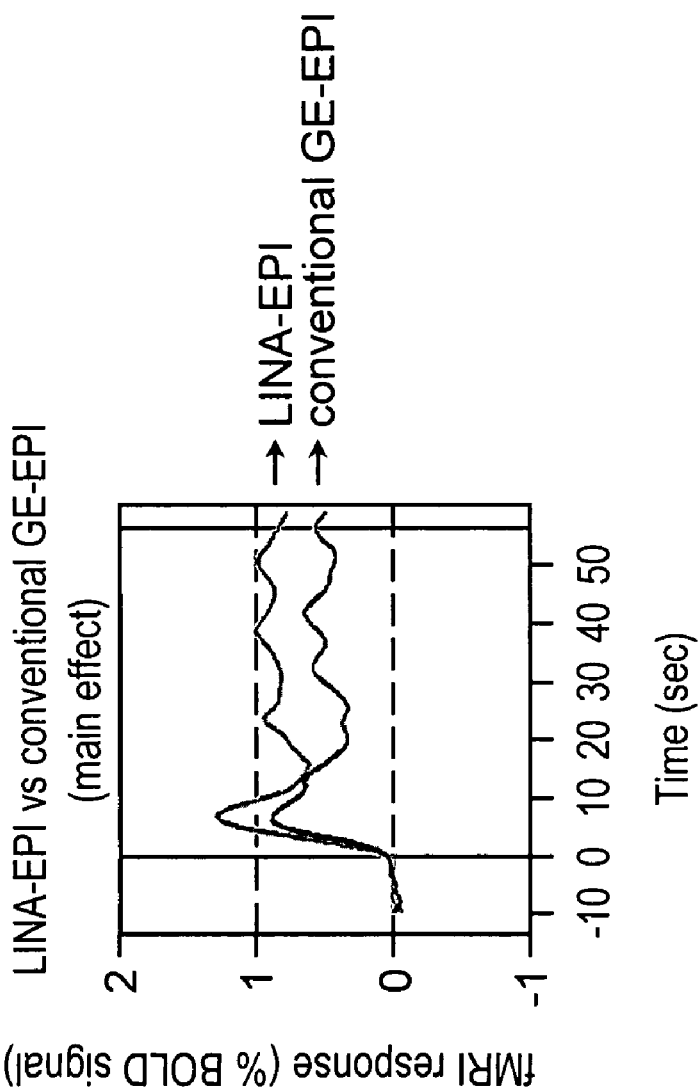
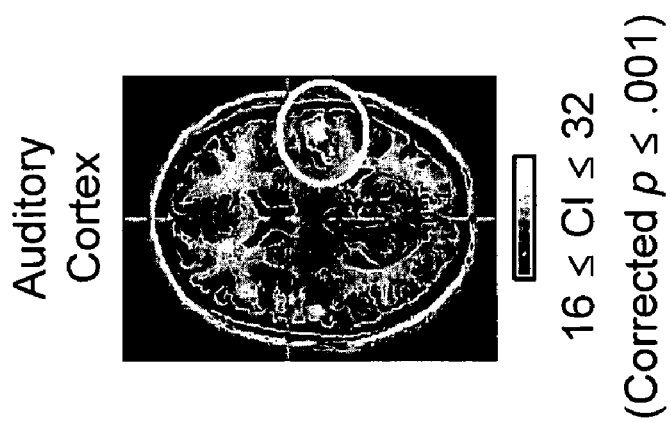
FIG. 10

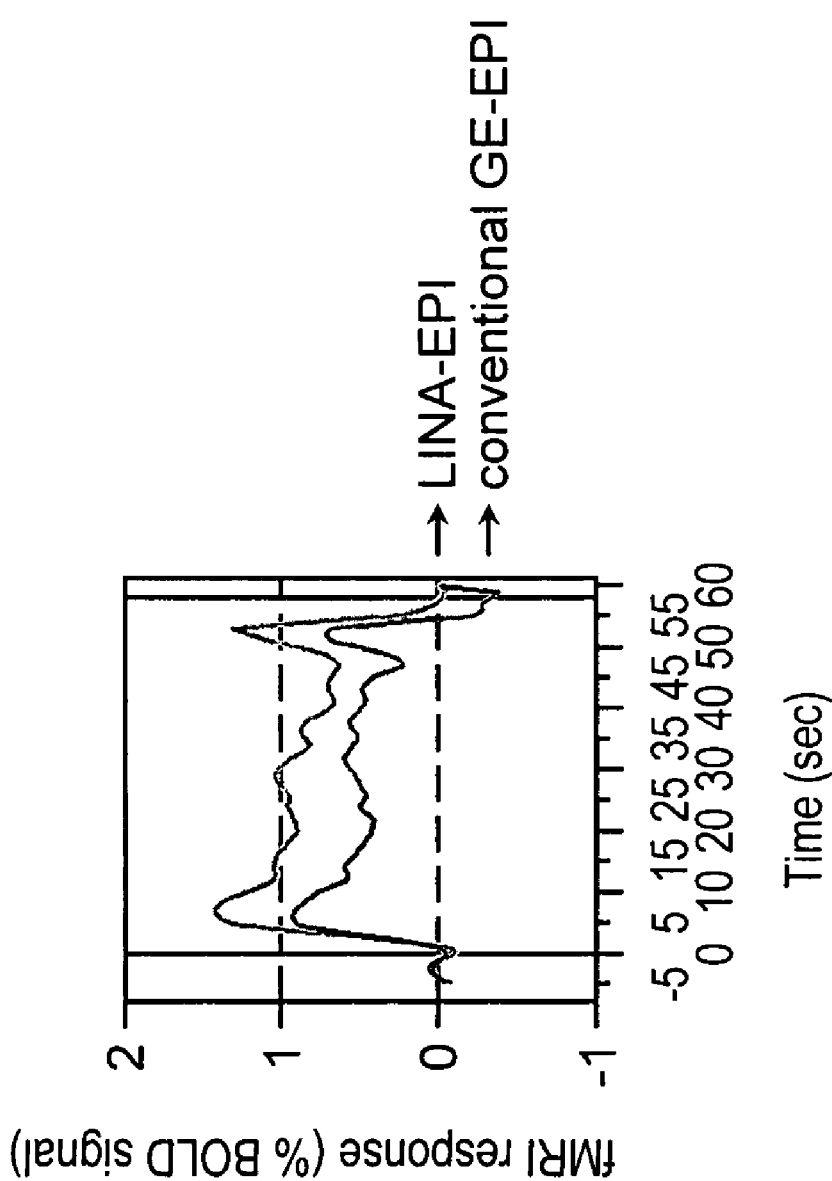
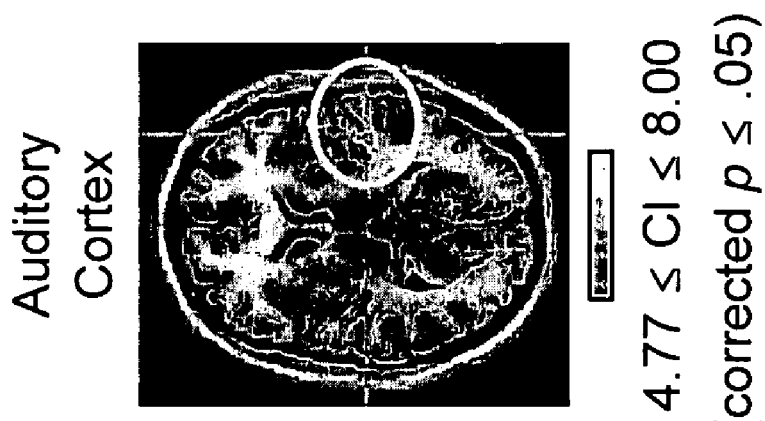
FIG. 11

LOW-IMPACT NOISE ACQUISITION MAGNETIC RESONANCE IMAGING

REFERENCE TO A CD-ROM APPENDIX

The present specification incorporates by reference two audio files, entitled "conventional-EPI-sound.wav" and "LINA-EPI-sound.wav," respectively, submitted on the CD-ROM entitled "Audio File Appendix," which is filed with the present specification. The "conventional-EPI-sound.wav." file was created on Apr. 29, 2004, and is a 753 KB wave file that includes a sound recording of conventional gradient noise produced by repetition of a GE-EPI measuring sequence during conventional GE-EPI fMRI scanning. The "LINA-EPI-sound.wav" file was created on Apr. 29, 2004, and is a 743 KB wave file that includes a sound recording of the continuous monotone background noise that results when using LINA-EPI fMRI scanning in accordance with the present invention.

FIELD OF THE INVENTION

Functional magnetic resonance imaging (abbreviated "fMRI") is based on T2* weighted gradient echo sequences (e.g., gradient Echo-Echo Planar Imaging, abbreviated "GE-EPI"), which acquire a differentially high signal in accordance with local blood oxygenation in the brain. This differential signal intensity, in accordance with variation in local blood oxygenation, is known as the "BOLD effect." During imaging, a high degree of undesirable background noise is generated by conventional fMRI scanning, which stimulates the hearing centers in the brain of subjects being scanned. Such stimulated hearing centers manifest an undesirable high signal due to the BOLD effect. To minimize the BOLD effect in the hearing centers of subjects undergoing FMRI scanning, a low-impact noise acquisition magnetic resonance imaging (abbreviated, LINA-MRI) method has been developed and is described herein. More specifically, the present invention describes a novel EPI gradient pulse sequence that produces continuous rather than pulsed acoustic noise by switching the read-out and phase encoding gradients in a quasi-continuous way, and by using smoothly ramped slice selection gradients (with long (ca. 2 ms) ramp-up and ramp-down times).

BACKGROUND OF THE INVENTION

Magnetic resonance imaging (MRI) techniques enable noninvasive functional brain mapping with high spatial and temporal resolution. Signal detection in functional MRI (FMRI) is based on the blood oxygenation level dependent effect produced by the different paramagnetic and diamagnetic properties of deoxyhemoglobin and oxyhemoglobin. Neuronal activation, via the neurovascular coupling cascade, is associated with an increase of local oxyhemoglogin and a relative decrease of deoxyhemoglobin in the venous bed which enhances signal intensity in $T_2$*-weighted MR-images.

Due to its advantageous flexibility and the astonishingly detailed spatial and temporal information it provides, FMRI has become the most widely used imaging tool for studying brain function in humans. Nevertheless, until recently, the study of the brain's auditory system has progressed at a considerably slower pace than other functional systems. This is because FMRI studies of the auditory system are confounded by problems arising from the high intensity acoustic noise produced by gradient switching during echo-planar imaging (abbreviated "EPI"). In particular, during operation scanner noise arises when pulses of current are passed through the gradient coil for spatial encoding of the MR signal. Since the gradient coil is placed inside a strong magnetic field, a pulsed Lorenz force is induced. This force vibrates the coil structure, which in turn generates a compression wave in the air that is perceived as the "scanner noise." Researchers Hedeen and Edelstein, Magn. Reson. Med., Vol. 37, pp. 7–10, 1997, have shown that the response of an MRI gradient system to pulsed currents is linear. Consequently, the sound spectrum generated by a particular gradient current waveform is the product of the frequency response of the gradient system and the Fourier transform of the waveform. The switched gradient field, which is proportional to the gradient current, along read, phase, and slice directions of a conventional EPI gradient pulse sequence is shown in FIG. 1. FIG. 1 also demonstrates the excitation and acquisition timing of the conventional EPI pulse sequence.

Conventional EPI pulse sequence timing used to acquire a single image slice consists of two parts. First, magnetization is excited with a slice selective (radio frequency) RF pulse, sometimes preceded by a fat suppression pulse, followed by navigator echoes, which takes about 5–30 ms. Second, the magnetization is spatially encoded and acquired during an oscillating read gradient (abbreviated "GR") and a blipped phase encoding gradient (abbreviated "GP"), which takes about 50–130 ms. The read gradient has a trapezoidal or sinusoidal wave form with a period of 0.5 ms to 2.0 ms. The number of positive and negative read gradient lobes is between 50 to 130.

The EPI sequencing thus generates acoustic noise consisting mainly of two components: (1) a first tone with a frequency of 500–2000 Hz and 50–130 ms duration, produced by the read gradient; and (2) an interruption period lasting for 5–30 ms during excitation and navigator echo acquisition, wherein the first tone is interrupted. Consequently, the acoustic noise generated by a conventional EPI pulse sequence is roughly a pulsed tone with frequency of 500–2000 Hz and pulse rate of 7–20 Hz, as visually demonstrated in FIGS. 2a and 2b. It turns out that the human auditory system is particularly sensitive to pulsed tones within this range of pulse, or repetition rates, generated by conventional EPI pulse sequences.

In practice, EPI noise can reach sound pressure levels (SPL) in the range of about 100 decibels (dB), depending on such factors as the specific imaging sequence, type of gradients, brand of scanner, slice thickness, spatial resolution, bandwidth of data acquisition, and size of the subject examined. The background noise that results from generating the EPI pulse sequence actually activates the auditory system and interacts unpredictably with the true experimental stimuli during studies of functional activation tasks, thereby confounding determinations of hearing threshold of experimental stimuli, studies of phonetic discrimination, and studies of foreground-background discrimination. Therefore, contamination of a test subject's response to an experimental auditory stimulus when exposed to environmental noise within the bore of the MRI magnet is of great concern.

As demonstrated by Ogawa et al., Proc. Natl. Acad. Sci., Vol. 89, pp. 5951–5955, 1992, fMRI, which is based on T2* weighted GE-EPI sequences, acquires a differentially high signal in accordance with local blood oxygenation in the brain, an effect known as the "blood oxygenation-level-dependent effect" or "BOLD effect." The proton signal-intensity alterations, or contrast, created by the BOLD effect occurs as a result of magnetic-susceptibility variation in living tissues. In particular, the magnetic susceptibility variation observed as the BOLD effect is caused by deoxyhemoglobin, which is an endogenous paramagnetic contrast agent. Areas in the brain that are relatively metabolically active (i.e., have more neuronal activation) at the time of FMRI scanning consequently have relatively more oxyhemoglobin, due to the neurovascular coupling cascade, and relatively lower levels of deoxyhemoglobin consumption due to increased blood flow in local venous beds. This relative increase in local oxyhemoglobin with a relative decrease in deoxyhemoglobin results in higher signal intensity in the $T_2$*-weighted MR-images, which is observable as the BOLD effect.

Almost exclusively, GE-EPI sequences are used for fMRI, which provides the following advantages: (a) allows for a very quick image capture (i.e., approximately 70–100 ms per slice); (b) offers a good local resolution (i.e., approximately 2×2×2 $mm^3$); and, (c) with respect to the BOLD effect, provides an optimal echo time TE (i.e., approximately 40–70 ms at 1.5 T, or approximately 20–40 ms at 3T). A typical GE-EPI sequence can be divided into two time segments: (1) the slice selective excitation (i.e., RF-pulse, slice selection gradient with refocuser) time segment and (2) the echo-planer acquisition in the k-space (i.e., oscillating reading gradient and phase coding gradients) time segment. A representative illustration of a conventional working GE-EPI pulse sequence used for fMRI is provided in FIG. 3. However, acoustic noise generated by conventional EPI gradients, as discussed above, is characterized by complex bursts occurring with each imaging slice. With fast fMRI, EPI gradients are repeated eight to twelve times per second and the noise generated excites the auditory cortex. Like other sensory systems, the auditory cortex is highly susceptible to stimulus presentation rates in this range, but responses progressively decrease as repetition rates increase as illustrated by FIG. 4.

As mentioned, during scanning repetition of the GE-EPI measuring sequence creates a characteristic noise gradient in the scanner with a loudness of approximately 90–100 dB volume. Specifically, the gradient coils of the scanner generate noise as their polarities are rapidly changed in accordance with the EPI sequence. This characteristic background noise is largely composed of a high-frequency component (approximately 500–1500 Hz generated by the oscillating reading gradients) and a low frequency component (approximately 10 Hz generated by a repetition of the measurement of approximately 100 ms duration, particularly by means of a 100 ms periodic interruption of the oscillating reading gradient by the layer selection gradient). This loud background noise, which can be best appreciated by listening to the sound recording entitled "conventional-EPI-sound.wav," incorporated herein by reference, causes various kinds of negative effects in preclinical and clinical FMRI investigations in animals and humans.

Various workgroups, such as by Seifritz et al. (See Science, Vol. 297, pp. 1706–1708 and supporting online materials, 2002), have confirmed that background noise generated by fMRI scanners during scanning creates a negative, confounding effect on imaging. Conventional GE-EPI gradient noise generated by the MRI scanner results in direct neural activation, with BOLD signal enhancement, in the hearing center of scanned human subjects' brains. Other researchers have shown that conventional GE-EPI acoustic noise of the gradient systems may directly induce neuronal and BOLD activation of the auditory cortices, and in other regions of the brain as well, such as in the visual or motor cortices thereby causing interagonism (See Cho et al., Magn. Reson. Med., Vol. 39, pp. 331–335, 1998). Conventional GE-EPI acoustic background noise of the gradient systems negatively influences cognitive exertion, as well as the neural bases for the same, and is generally perceived by patients and test subjects to be disturbing and unsettling. Other researchers have found that GE-EPI gradient noise specifically diminishes the ability to discriminate acoustic speech stimulation (See Shah et al., Neuroimage, Vol. 12, pp. 100–108, 2000), which is particularly disadvantageous in connection with clinical investigations directed to preoperative localization of the speech center before a neurosurgical intervention (See Sabsevitz et al., Neurology, Vol. 60, pp. 1788–1792, 2003).

In view of these problems arising from background noise, worldwide intensive research is being conducted to reduce the gradient noise of fMRI sequences and several strategies have emerged to overcome this intrinsic problem. Methods for reducing the affects of gradient noise on the auditory system can be divided into three categories: (a) silent MRI sequences, (b) the use of passive and/or active noise reduction devices, and (c) exploiting the delayed onset of the BOLD signal change that follows acoustic stimulation so as to separate gradient noise from experimental stimuli.

The so-called silent sequences, for example BURST (See Hennig and Hodapp., Magma, Vol. 1, pp. 39–48, 1993, and Jakob P M et al, Magn Reson Med. 1998 October;40(4): 614–21) and SIMEX (See Loenneker et al., Magma, Vol. 13, pp. 76–81, 2001) sequence technologies, fundamentally allow the gradient noise to be significantly minimized by generating a sound level that is much lower than the sound level of experimentally delivered stimuli. Silent sequences use slowly changing pulse shapes based on soft, or sinusoidal, ramps for all three gradient axes. This technique is generally not applicable to EPI sequences, but it can be applied to alternative acquisition techniques (i.e., FLASH sequences). While the application of silent sequences to fMRI can provide significant noise reduction reaching noise levels as low as 40 dB, this advantage is achieved, however, with a noticeable loss in temporal resolution of the fMRI measurement. In fact, the reduction in temporal resolution occurs at a factor of up to 300, which leads to significant and generally unacceptable lengthening of the measuring period (e.g., it may take several seconds to for each image slice) needed for clinical or scientific investigation. Consequently, this trade off of diminished temporal resolution in exchange for less gradient noise is impractical because the increased amount of scanning time required to make up for the decreased resolution is not commercially viable.

The BURST technique has been used to generate silent and rapid sequences and overcome the temporal resolution problem. The BURST technique utilizes a train of excitation pulses applied during a single, constant magnetic field gradient. This RF-burst generates a train of echoes that can be acquired with a second, single read-out gradient. As a result, the BURST technique does not require rapidly switched magnetic field gradients, which reduces imaging noise to about 40–50 dB. Compared to EPI, silent BURST offers nearly identical imaging speed; however, signal-to-noise ratio (abbreviated "SNR") is about 5 to 10 times less for BURST sequences than for either new or conventional EPI. In other words, the use of "quiet" fMRI sequences, such as FLASH sequences, results in significantly slower scanning or, in the case of BURST sequences, has an unacceptably bad signal-to-noise ratio compared to EPI sequences.

Other researchers have experimented with methodical approaches for reducing the GE-EPI noise using passive and/or active noise dampening (See Chen et al., IEEE Trans. Biomed. Eng., Vol. 46, pp. 186–191, 1999). The about 10 Hz pulsed background noise generated by the GE-EPI measurement can be passively reduced (e.g., by means of earplugs or headphones) or actively reduced (e.g., by means of a counter noise). The combined use of earmuffs and earplugs can passively attenuate GE-EPI noise by up to 40–50 dB but it cannot be entirely suppressed because noise conduction through body tissue permits up to 50 dB of noise to be conducted to the middle ear.

Active noise dampening techniques utilize an active device that produces a phase-reversed noise emission. If the cancellation noise is emitted inside earmuffs, the technique achieves only about a 20–30 dB reduction in noise because body tissues still conduct noise. While it is difficult to produce noise emissions outside of earmuffs that are exactly phase-reversed to the magnetic gradient noise components, which travel through the body, some success has been achieved by combining active noise reduction techniques with a passive noise reduction technique, thereby achieving noise cancellation as high as 50–60 dB (See Ravicz et al., J. Acoust. Soc. Am., Vol. 108, pp. 1683–1696, 2000). Unfortunately, the characteristic knocking noise (often referred to as "banking") of EPI gradient noise remains. Passive and/or active noise dampening, therefore, does not lead to completely satisfactory noise reduction because the effectiveness of these techniques depend upon both (a) the amount of noise energy, and (b), in particular, the kind of noise. More specifically, GE-EPI magnetic gradient noise is typically pulsed in character (i.e., banked or banking) and results in direct brain activation. Banking GE-EPI noise stimulates the brain in a manner that uses up cognitive resources and disturbs the test subjects despite attempts to actively and/or passively dampen the noise.

The third technique to diminish the effect of background gradient noise on scanning subjects attempts to separate the EPI scanner noise from experimental noise stimuli by taking advantage of the temporal delay separating neural stimulation from its hemodynamical effects and using an intermittent scanning approach. Generally speaking, the BOLD signal change induced by a neuronal stimulation appears only after a delay that is on the order of a few seconds, and the decay of the BOLD signal to baseline equilibrium takes at least 10 seconds. This delay in the hemodynamic response function can be used to disentangle EPI noise from experimental acoustic stimuli. So, a multislice echo-planar slab of the auditory cortex can be sampled a few times as follows: (a) after an auditory stimulation; (b) before the corresponding BOLD signal decays completely; and (c) before the BOLD response to the gradient noise appears. In order to separate EPI scanner noise effects from the experimental noise stimulus effect, the separation of successive acquisition blocks should be long enough to allow the auditory system to recover from the BOLD response of the preceding noise-producing EPI acquisition period, and the scan period must be short enough so that imaging does not pick up the rising limb of the BOLD response to the gradient noise.

From a practical standpoint, to perform these noise separation techniques, certain assumptions must be made. Assuming a delay time of about 2 seconds between stimulus onset and the BOLD response, and a dispersion time of about 2 seconds, then scanning times shorter than 2 seconds and repetition times (abbreviated "TRs") of about 15 seconds or longer should be used. This intermittent scanning approach has been termed "clustered" or "sparse" sampling by some researchers (See Edmister et al., Hum. Brain Mapping, Vol. 7, pp. 89–97, 1999; Hall et al., Hum. Brain Mapping, Vol. 7, pp. 213–223, 1999). However, these intermittent scanning methods are unacceptably time consuming due to the TRs of 15 seconds or more when compared to conventional EPI measurement, which uses TRs of about 1 to 3 seconds.

As indicated above, FMRI scanners and scanning methods of the prior art are unable to satisfactorily address the following technical problem. The characteristic, approximately 8–15 Hz pulsed background noise generated during conventional GE-EPI measurement negatively influences the measurable BOLD effect. So, during fMRI measurement of the auditory system of the brain, the background GE-EPI gradient noise is increased and the reserve capacity of the BOLD signal, and therefore the measurable BOLD signal amplitude, is reduced. In addition, during FMRI measurement of the visual and motor systems of the brain, the BOLD signal is changed by means of complex neural, sensorial and cognitive interactions, although the mechanism responsible for these interactions is not completely understood. Consequently, during fMRI experiments investigating higher cognitive functions, the GE-EPI background noise massively detracts from experiments in cognitive ability by distracting and stimulating the test subjects. This same background noise activates various auditory, visual and motor centers in the brain, thereby distorting measurements determining the connection between cognitive ability and neuronal activation in these test subjects.

Other technical problems are also not adequately addressed by the prior art attempts to reduce GE-EPI background noise effects. For example, during pre-operative clarification studies, particularly when the localization of the speech center is desired, the GE-EPI noise adversely influences the ability to detect and define specific functional centers in a patient's brain, as well as the corresponding associated neural and BOLD activation. Furthermore, the GE-EPI noise is disruptive and uncomfortable for patients and test subjects, and this problem is not adequately mitigated by the prior art technologies.

In summary, the prior art technologies for reducing GE-EPI background noise have proven to be inadequate and/or impractical solutions. Quiet sequences cannot be effectively applied to solve the above-named technical problems because noise reduction can only be achieved with a correspondingly disadvantageous reduction in temporal resolution. This loss of temporal information can only be remedied by a several fold lengthening in clinical and experimental fMRI measurements; however, the required increase in scanning time makes the use of quiet sequences impractical. Passive and active noise reduction methods have also failed to provide a satisfactory solution to the above-mentioned noise-related problems because, while noise attenuation is achieved to some degree, a significant residual amount of "banking" still remains to excite the auditory system. However, whatever advantages obtained using passive and/or active noise reduction methods are at least equally obtainable in connection with the use of the "LINA-EPI" method in accordance with the present invention. Lastly, while prior art intermittent scanning techniques may separate the effect of magnetic field gradient noise from the effects of experimental auditory stimuli, this technique requires an unacceptable increase in the amount of scanning time required and does not actually decrease the level of noise experienced by the test subject.

The present invention endeavors to provide an improved LINA-EPI pulse sequencing method for effectively reducing the GE-EPI background noise of an fMRI scan while maintaining the advantages of the prior art technologies directed to solving this problem.

Accordingly, one object of the present invention is to overcome the disadvantages of the prior art methods for reducing gradient noise.

Another object of the present invention is to lessen activation of the brain's auditory system by undesirable magnetic gradient noise, thereby achieving about a 50% reduction in confounding BOLD signal effects.

A further object of the present invention is to lessen interference (See Cho et al., Magn. Reson. Med., Vol. 39, pp. 331–335, 1998) between auditory activation and activation of other sensorial and senso-motor systems.

A still further object of the present invention is to provide less interference (See Mazad et al., J. Cogn. Neurosci, pp. 172–186, 2002) between auditory stimulation and higher cognitive functions by means of lessening magnetic field gradient noise.

A still further object of the present invention is to lessen interference between auditory stimulation, caused by magnetic field gradient noise, and speech recognition, thereby improving preoperative function testing of the speech system (Shah et al., Neuroimage, Vol. 12, pp. 100–108, 2000).

Yet another object of the present invention is to heightened comfort of the patients and test subjects during MRI investigations by reducing GE-EPI gradient noise.

A still further object of the present invention is to overcome the problems of silent FMRI sequences by achieving satisfactory temporal resolution during FMRI experiments while reducing the impact of magnetic field gradient noise by altering the noise spectrum generated during fMRI scanning.

A yet further object of the present invention is to improve the technical possibilities for reducing effects of magnetic field gradient noise in a scanner, either actively and/or passively.

A still further object of the present invention is to reduce the effective impact of GE-EPI magnetic gradient noise during fMRI scanning procedures without significantly lengthening the scanning period required to generate acceptable images.

SUMMARY OF THE INVENTION

In accordance with the above objectives, the present invention replaces the conventional GE-EPI pulse sequence pattern with a low impact noise acquisition (abbreviated "LINA") pattern so as to modify the spectrum of the background gradient noise. The result of using this new LINA-EPI pulse sequence is a background gradient noise spectrum whose main components lie at approximately 80–100 Hz and 500–1500 Hz. Furthermore, when a LINA-EPI pulse sequence is used for fMRI scanning, the 10 Hz pulse rate characteristic of conventional GE-EPI pulse sequencing is left out, which results in a continuous, monotone background noise. The continuous, monotone magnetic field gradient noise produced by LINA-EPI pulse sequencing, in accordance with the present invention, is best appreciated by listening to the audio file entitled "LINA-EPI-sound.wav," which is incorporated herein by reference, and comprises acoustic noise to which the auditory system is less sensitive.

While the volume of the background gradient noise generated using LINA-EPI pulse sequencing is comparable to the volume of the background gradient noise generated using conventional GE-EPI methods, the nature and quality of the noise is remarkably different. The LINA-EPI pulse sequence of the present invention results in the generation of a monotonous and continuous gradient noise pattern during FMRI scanning, and it is this monotonous and continuous gradient noise pattern that is less disturbing to the auditory system of test subjects undergoing scanning. Thus, the monotonous and continuous gradient noise pattern resulting from LINA-EPI sequencing, in accordance with the present invention, creates a minimal confounding BOLD effect when compared to the pulsatile gradient noise pattern generated when conventional EPI sequencing is used.

In accordance with the above objects, the present invention provides a nuclear magnetic resonance imaging method comprising the steps of: generating a rapid gradient pulse sequence comprising a read and phase encode gradient, wherein the read and phase encode gradient includes multiple interrupted lobe clusters; generating substantially monotonous gradient noise substantially without banking; and imaging a test subject using the rapid gradient pulse sequence.

In accordance with another embodiment, the substantially monotonous gradient noise corresponds substantially to the sound file "LINA-EPI-sound.wav."

In a further embodiment, the rapid gradient pulse sequence is a LINA-EPI pulse sequence that includes an RF excitation pulse, a slice gradient, and a phase encoding gradient. Each lobe cluster of the read gradient includes 3 to 20 lobes, and a first lobe cluster is separated from a second lobe cluster by a time interval of about 0.2 to 2 ms. The phase encoding gradient includes multiple interrupted blip clusters, wherein each blip cluster includes 3 to 20 blips, and a first blip cluster is separated from a second blip cluster by a time interval of about 0.2 to 2 ms. The slice gradient includes one or more pulses having slow gradient ramps, each gradient ramp lasting longer than 2 ms. The RF excitation pulse is transmitted during a window lasting about 0.2 to 2 ms, and during this window both the read gradient and the phase gradient are zero.

In accordance with yet another embodiment, there is provided a nuclear magnetic resonance imaging method that utilizes a LINA-EPI gradient pulse sequence, comprising the steps of: generating a LINA-EPI gradient pulse sequence comprising a read gradient, a RF excitation pulse, a slice gradient, and a phase encoding gradient; generating substantially monotonous gradient noise as a result of generating the LINA-EPI gradient pulse sequence, wherein the substantially monotonous gradient noise is substantially without banking and minimizes confounding BOLD effects during imaging; and imaging a test subject using the LINA-EPI gradient pulse sequence. Preferably, the read gradient includes multiple interrupted lobe clusters. Each lobe cluster preferably includes 3 to 20 lobes, and a first lobe cluster is separated from a second lobe cluster by a time interval of about 0.2 to 2 ms. In another preferred embodiment, each lobe cluster includes 7 lobes, and a first lobe cluster is separated from a second lobe cluster by a time interval of about 0.850 ms. The phase encoding gradient preferably includes multiple interrupted blip clusters.

In a still further embodiment, each blip cluster includes 3 to 20 blips, and a first blip cluster is separated from a second blip cluster by a time interval of about 0.2 to 2 ms. Preferably, the slice gradient includes one or more pulses having slow gradient ramps, each gradient ramp lasting longer than 2 ms. Still preferably, the RF excitation pulse is transmitted during a window lasting about 0.2 to 2 ms, and during this window both the read gradient and the phase gradient are zero.

In accordance with yet another embodiment of the invention, there is provided a nuclear magnetic imaging apparatus programmed to perform LINA-EPI gradient pulse sequencing, the apparatus comprising a magnet assembly, and an imaging processing assembly. The magnet assembly includes: i. a magnet for generating a uniform static magnetic field along a Z-axis; ii. a gradient magnetic field coil assembly for generating a gradient magnetic field in a measuring space; iii. an RF coil for generating an RF magnetic field in the measuring space; and iv. an RF probe envelope disposed to detect MR signals generated by a test subject in the measuring space. The imaging processing assembly includes: i. a gradient magnetic field power source operably connected to energize the gradient magnetic filed coil assembly; ii. an RF transmission unit operably connected to energize the RF coil; iii. a signal detection unit operably connected to receive an MR signal from the RF probe envelope; and iv. a control unit operably connected to the gradient magnetic field power source, the RF transmission unit, and the signal detection unit. The control unit is programmed to control the gradient magnetic field power source and the RF transmission unit so as to generate a LINA-EPI gradient pulse sequence using the gradient magnetic field coil assembly and the RF coil, wherein the LINA-EPI gradient pulse sequence includes a read gradient, a RF excitation pulse, a slice gradient, and a phase encoding gradient, wherein the apparatus generates substantially monotonous gradient noise as a result of generating the LINA-EPI gradient pulse sequence, wherein the substantially monotonous gradient noise is substantially without banking.

Further objects, features and advantages of the present invention will become apparent from the Detailed Description of Illustrative Embodiments, which follows, when considered together with the attached drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 3 is a representative conventional GE-EPI pulse sequence of the prior art used in fMRI scanning, wherein

FIG. 6a schematically shows the timing of a LINA-EPI pulse sequence embodiment in accordance with the present invention, wherein curve RF/ADC represents radio frequency/analog-to-digital conversion of echoes; curve GS represents the slice select gradient; curve GP represents the phase encode gradient; and curve GR represents read gradient.

FIG. 6b illustrates various components of the GR sequence and the GS sequence shown in FIG. 6a.

FIG. 7 is a representative illustration of a LINA-EPI pulse sequence in accordance with the present invention, wherein

FIG. 9 includes an MRI image exhibiting BOLD activation of the auditory cortex with a graph of BOLD signal intensity versus time comparing scans during which conventional (filled dots) and LINA-EPI (open dots) sound recordings were presented as auditory stimulus against a silent background, the sound stimuli being given in sound files "conventional-EPI-sound.wav" and "LINA-EPI-sound.wav" respectively.

FIG. 10 includes an MRI image exhibiting BOLD activation of the auditory cortex by a simple auditory tone with a graph of FMRI response (% BOLD signal) versus time comparing scans using a conventional EPI pulse sequence to scans using a LINA-EPI pulse sequence.

FIG. 11 includes an MRI image exhibiting BOLD activation of the auditory cortex by a complex auditory sound with a graph of fMRI response (% BOLD signal) versus time comparing scans using a conventional EPI pulse sequence to scans using a LINA-EPI pulse sequence.

DETAILED DESCRIPTION OF ILLUSTRATIVE EMBODIMENTS

The present invention pertains to a new LINA-EPI pulse sequence pattern and a method of fMRI scanning that utilizes this new LINA-EPI pulse sequence pattern in order to mitigate the effect of magnetic field gradient noise on the auditory system, as well as on other functional brain centers or systems, of test subjects undergoing FMRI scanning procedures. To mitigate the effect of gradient noise on test subjects, the LINA-EPI sequence pattern in accordance with the present invention results in the generation of a modified, or adapted, gradient acoustic noise pattern that is relatively continuous and monotonous, to which the auditory system exhibits minimized sensitivity. This desired modification of the spectrum of background gradient noise is achieved by using a LINA-EPI pulse sequence, which includes a continuous switching of the reading gradient and the phase blip, as well as a slow ramping of the layer (i.e., slice) and phase coating gradients, as will be described in detail below.

Figure 5:
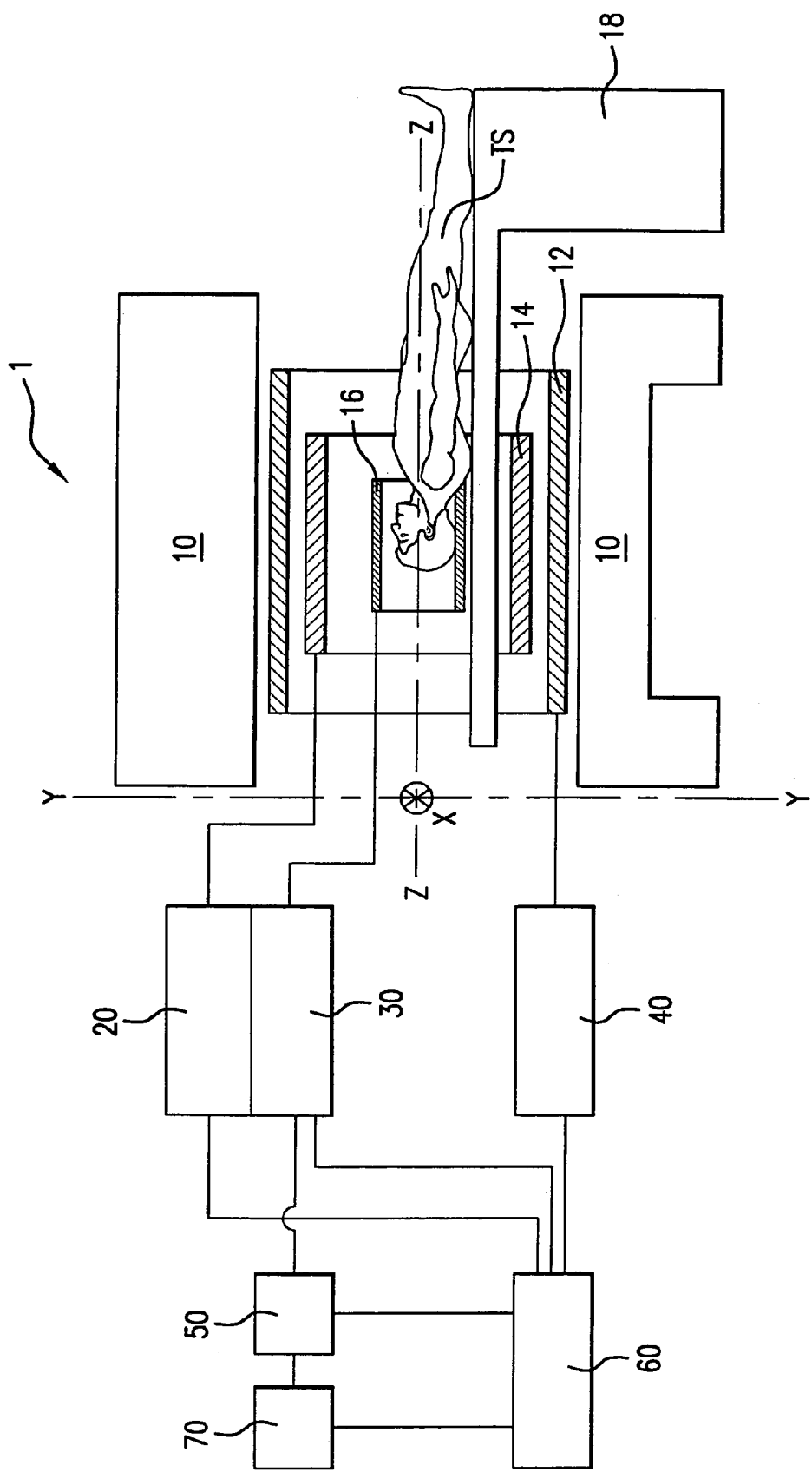
FIG. 5 is a schematic representation of a conventional MRI scanner programmable to perform LINA-EPI sequencing in accordance with the present invention, and the symbol "⊗" denotes that the X-axis is oriented into the page.
Figure 7A:
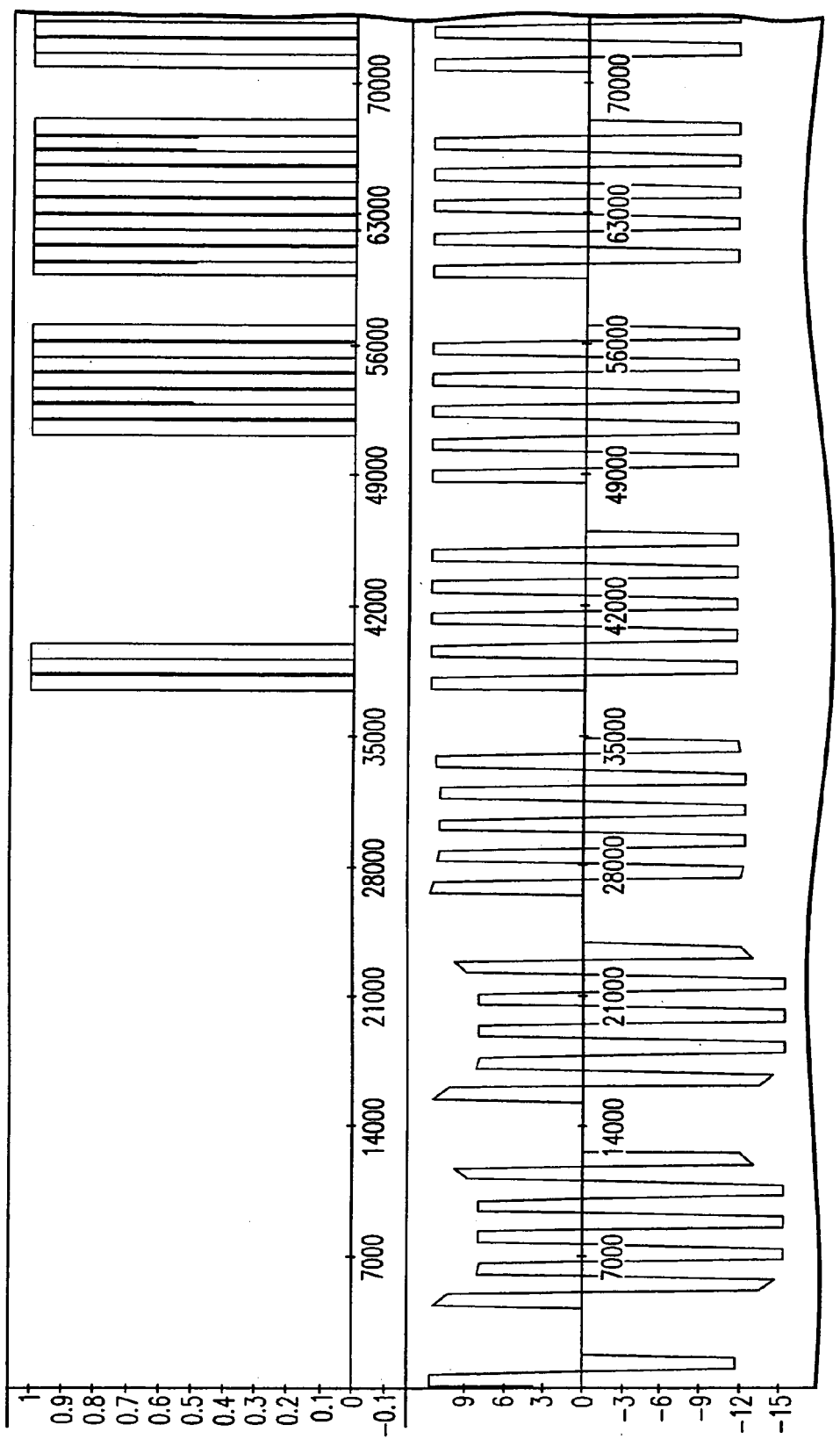
FIGS. 7a to 7f represent various component portions of the total LINA-EPI pulse sequence.
Figure 7B:
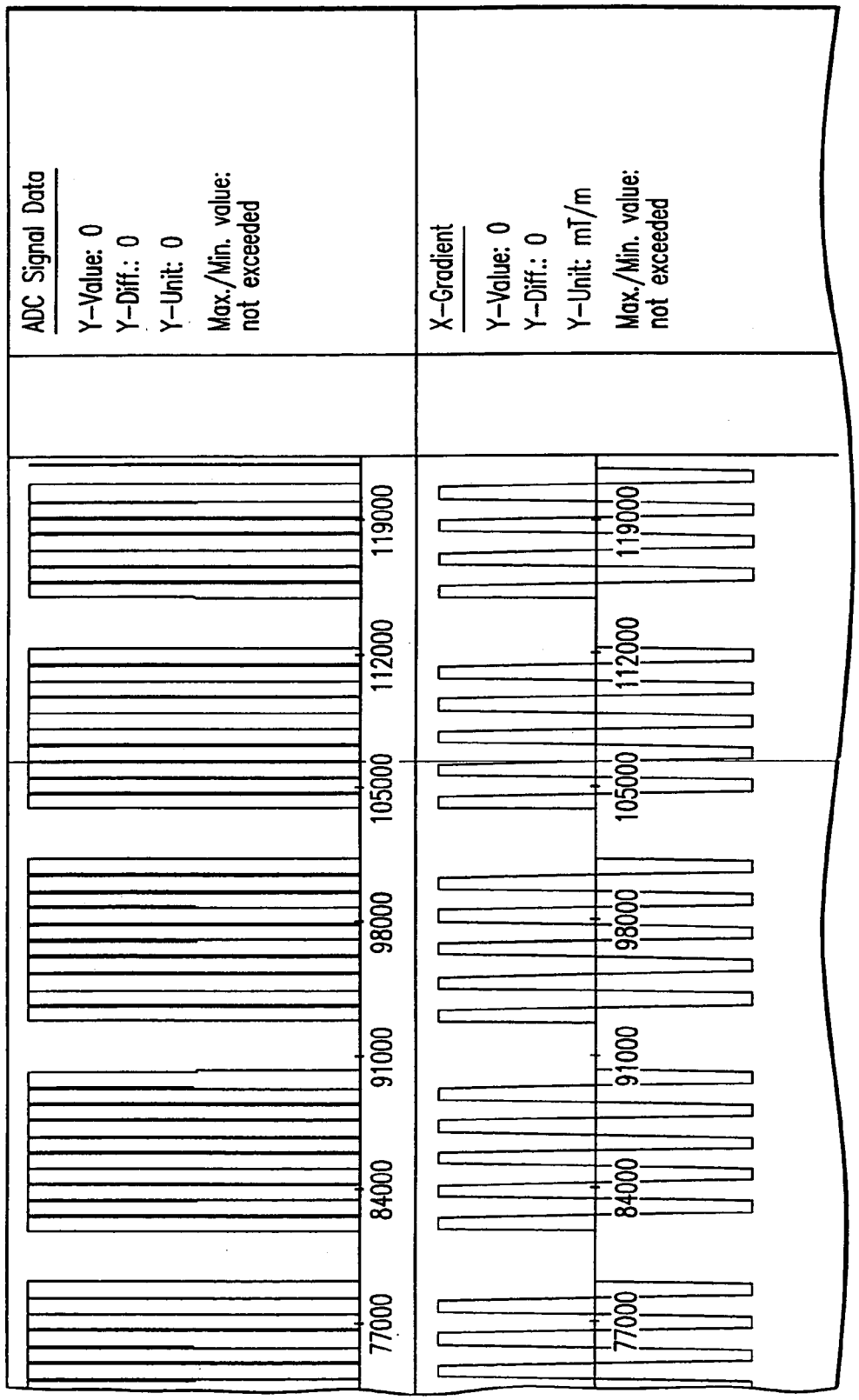
Figure 7C:
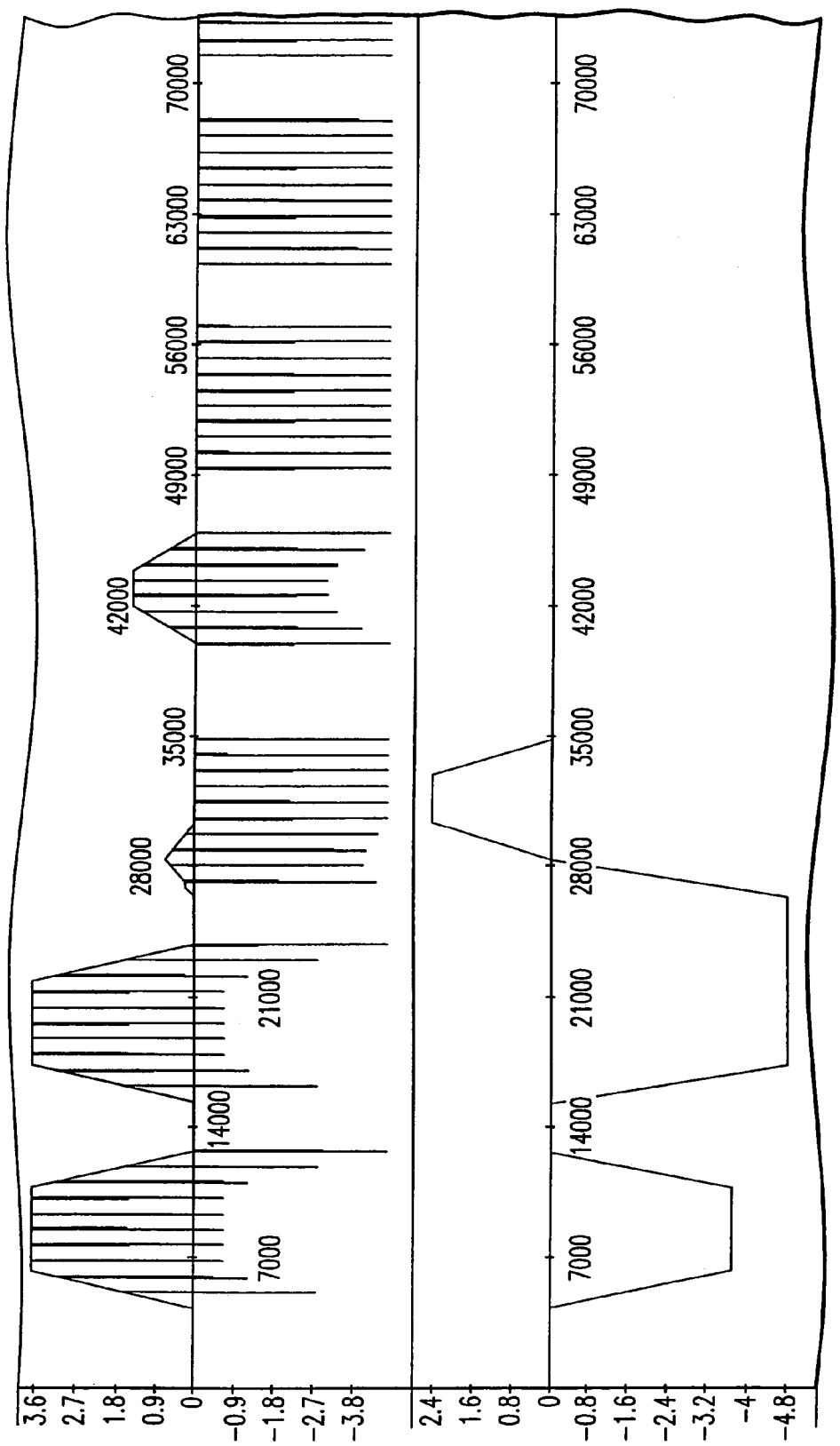
Figure 7D:
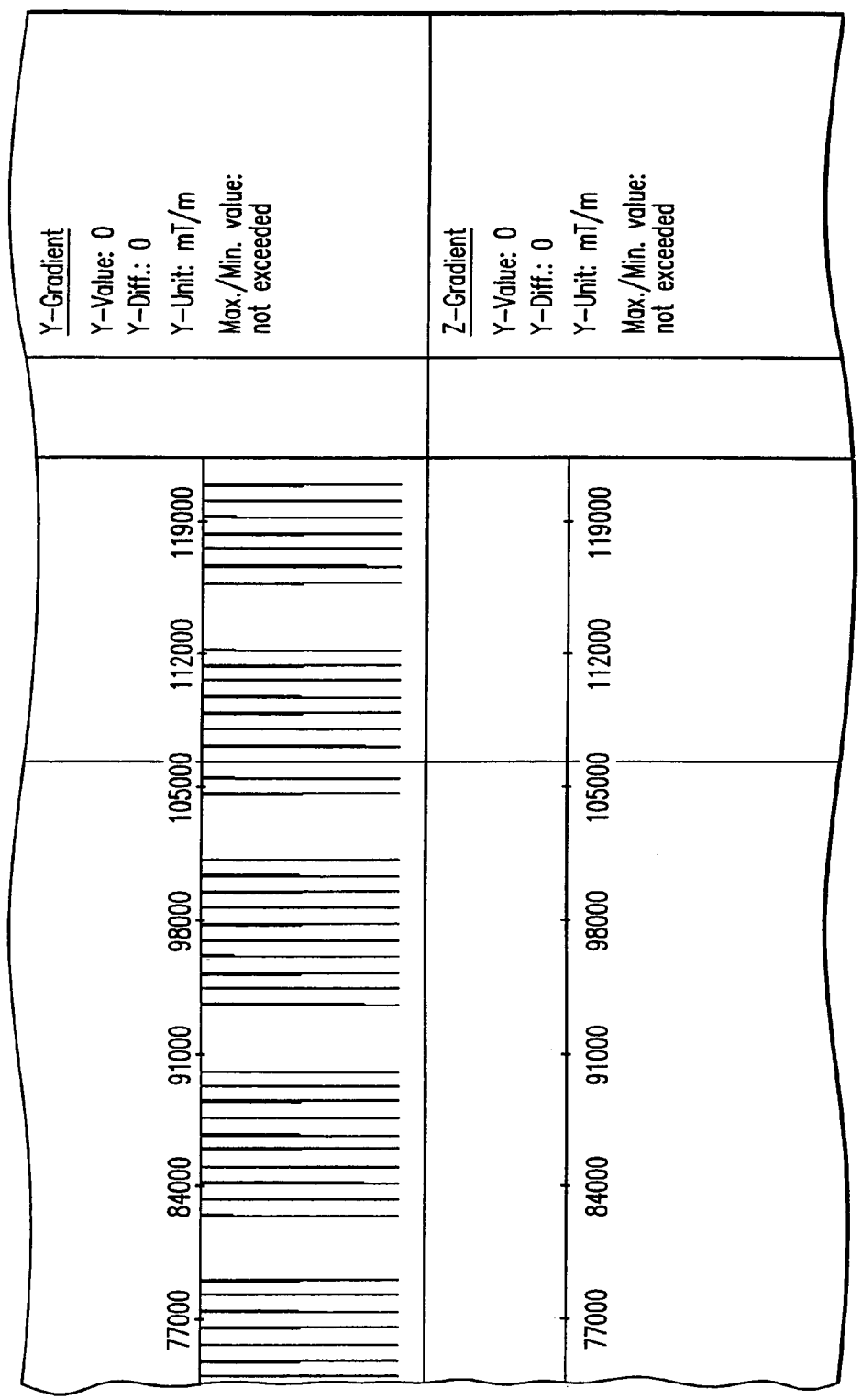
Figure 7E:
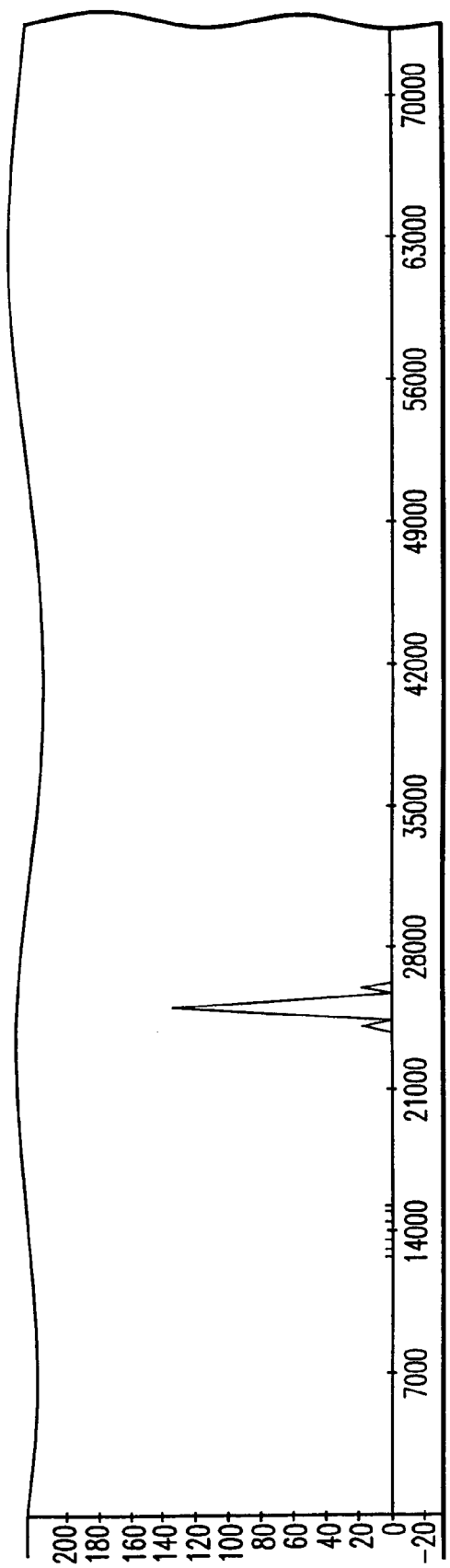
Figure 7F:
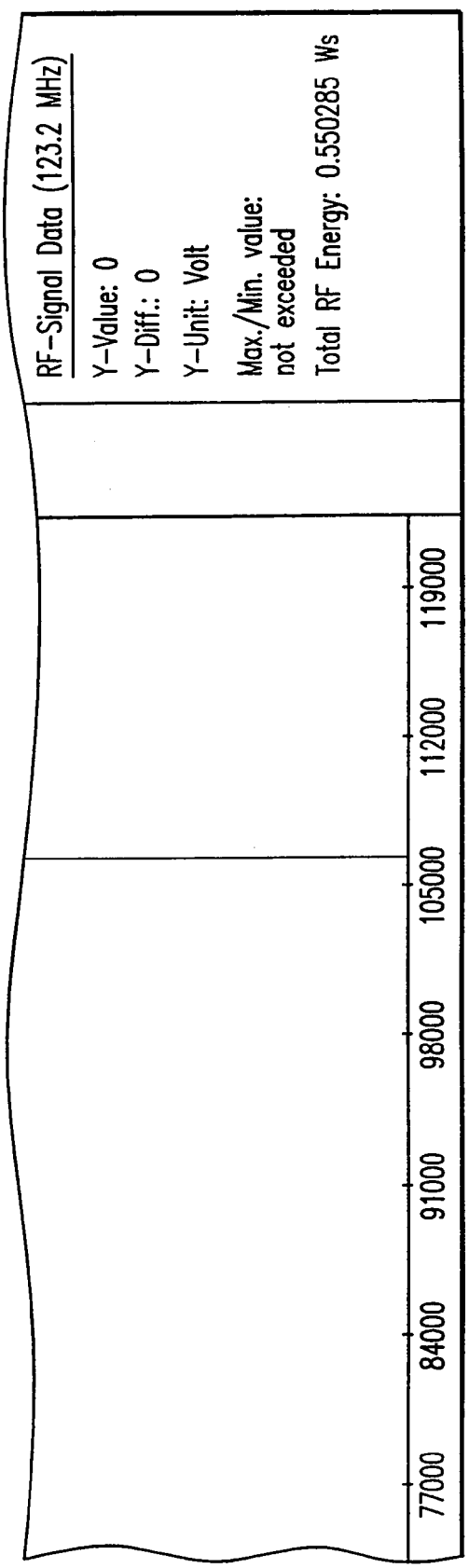

The LINA-EPI pulse sequence embodiment, in accordance with the present invention, is generated using a conventional MRI scanner apparatus 1, such as illustrated in FIG. 5, which is capable of fMRI scanning, but is programmed to generate LINA-EPI pulse sequences in place of the conventional GE-EPI pulse sequence. Scanner 1 has a magnet assembly that includes (a) magnet 10 for generating a uniform static magnetic field in the measuring space along the z-axis; (b) a gradient magnetic field coil assembly 12 for generating a gradient magnetic field in the measuring space; and (c) an RF coil 14 for generating an RF magnetic field in the measuring space. The magnet assembly of scanner 1 also includes an RF probe envelope (e.g., RF receiver coil) 16 positioned to detect MR signals generated by a test subject TS when the scanner is in use. A test subject positioning assembly 18 is generally provided for positioning and supporting the test subject TS during scanning.

Scanner 1 also includes an image processing assembly operably connected to the magnet assembly. The image processing assembly includes (a) a control unit 60, (b) a gradient magnetic field power source 40, (c) an RF transmission unit 20, (d) a signal detection unit 30, (e) a signal processing unit 50, and (f) a display unit 70. The control unit 60 is connected to send sequences of control pulses to the gradient magnetic field power source 40, which in turn is connected to send signals to the gradient magnetic field coil assembly 12. The gradient coil assembly 12 includes gradient magnetic field coils in the x, y and z directions, with each field coil generating gradient magnetic fields in accordance with signals received from the power source 40. In this way, a LINA-EPI magnetic field gradient can be applied in a pre-selected direction to superimpose in the measuring space with the uniform static magnetic field generated by magnet 10 so that spins can be selectively excited in a desired region (i.e., a slice or a slab) of the test subject TS.

The control unit 60 is also connected to send control signals to the RF transmission unit 20, which is connected to send signals to RF coil 14 so that an RF magnetic field gradient is generated in the measuring space as well. The magnetic field gradient perturbs the selectively excited spins in the desired region, which then generate MR signals in the RF probe envelope 16 as they relax. The signal detection unit 30 is connected to the probe 16 and detects the MR signals induced in the probe. When MR signals are detected, the signal detection unit 30 sends detection signals to the signal processing unit 50, where they are processed and converted to image signals by calculation. The image signals are then displayed as an image on the display unit 70 and/or printed. The image signals can also be stored in a memory (not shown) of the control unit 60.

The control unit 60 is programmed and operable to control the gradient magnetic field power source 40 that energizes the x, y and z magnetic field coils, to control the RF transmission unit 20, and to control the signal detection unit 30. Thus, the timed manipulation (i.e., time charts) of the X, Y, and Z magnetic field gradients (which correspond to the read, the phase-encoding and the slice gradients, respectively), the RF magnetic field gradient, and signal detection are all controlled by the control unit 60. This timed manipulation under the control of the control unit 60 is typically referred to in the art as the "pulse sequence." In other words, the control unit 60 is programmed to control the generation of LINA-EPI pulse sequences of the present invention, which includes the following magnetic field gradients: the read gradient (also known as the X-gradient), the phase-encoding gradient (also known as the Y-gradient), the slice select gradient (also known as the Z-gradient), and the RF pulse.

Illustrative LINA-EPI Sequences:

A LINA-EPI pulse sequence embodiment in accordance with the present invention is schematically illustrated in FIGS. 6a and 6b, and includes (a) a read gradient (GR), (b) a phase encoding gradient (GP), a slice select gradient (GS), and an RF excitation pulse gradient. In this LINA-EPI pulse sequence embodiment, the control unit 60 is programmed to generate the read gradient (GR) pulses, which comprise multiple clusters of lobes separated by a short interval A of about 0.2–2 ms. Each lobe cluster C includes 3–20 lobes, also referred to as echoes, and each lobe cluster C is separated from the lobe preceding cluster by a 0.2 to 2 ms interval A. Each lobe B in a cluster is about 0.5 to 2 ms in duration, peak-to-peak. The control unit 60 directs the power source 40 to energize the magnetic field coils of gradient coil assembly 12 so as to generate the magnetic field of the read gradient, preferably oriented along the X-axis, that inverts for multiple clusters wherein each cluster is separated from the preceding cluster by a short time interval of about 0.2 to 2 ms. The GR pulse encodes each echo that will be sampled during data acquisition.

Figure 1:
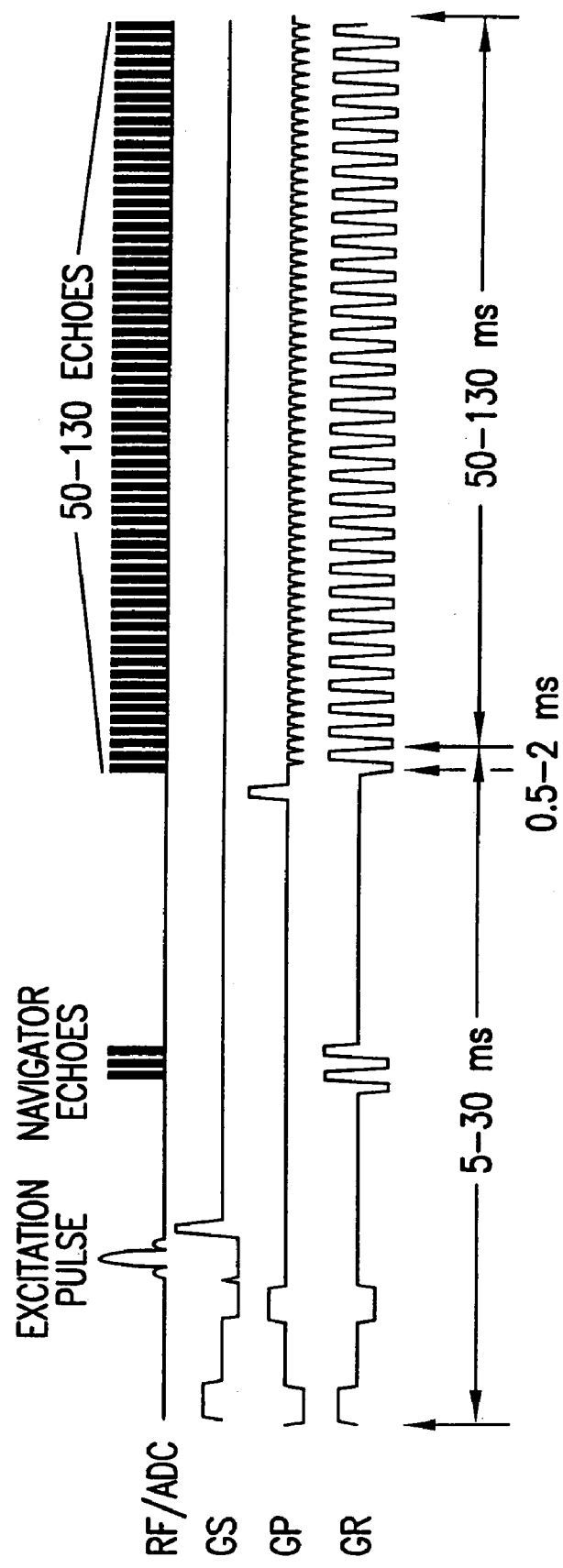
FIG. 1 schematically shows the timing of a conventional EPI pulse sequence, wherein curve RF/ADC represents radio frequency/analog-to-digital conversion of echoes; curve GS represents the slice select gradient; curve GP represents the phase encode gradient; and curve GR represents the read gradient.
Figure 2A:
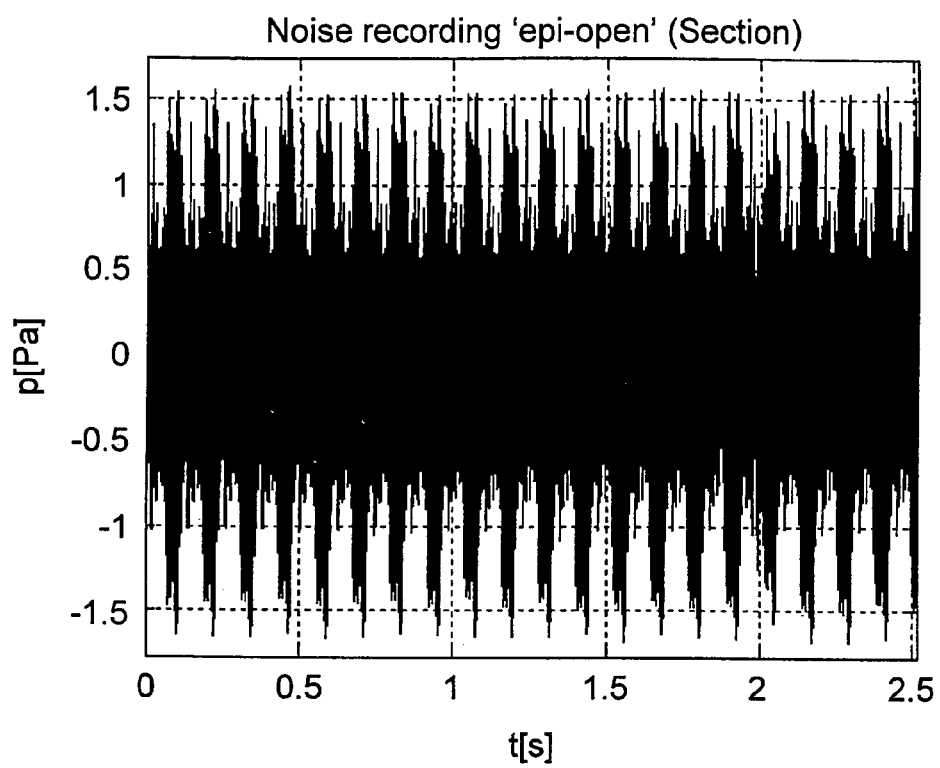
FIG. 2a is a graph of the measured acoustic noise of a conventional EPI sequence.
Figure 2B:
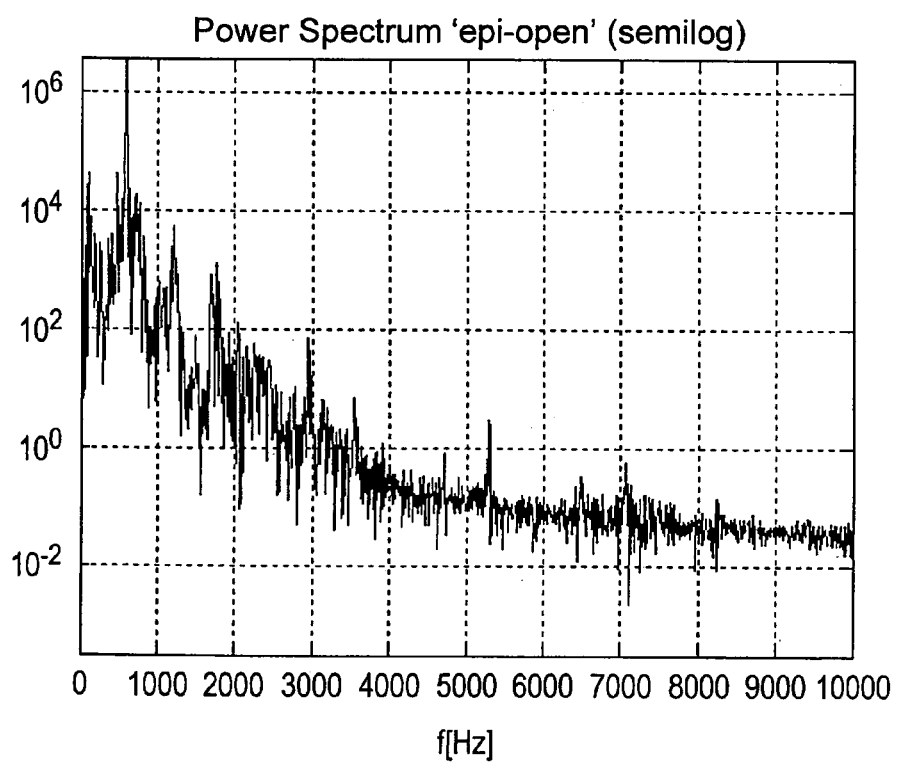
FIG. 2b is the power spectrum corresponding to the graph of FIG. 2a wherein the peak sound amplitude (SPL) is 98.8 dB(A), and minimal sound amplitude (SPL) is 47.1 dB(A).
Figure 3A:
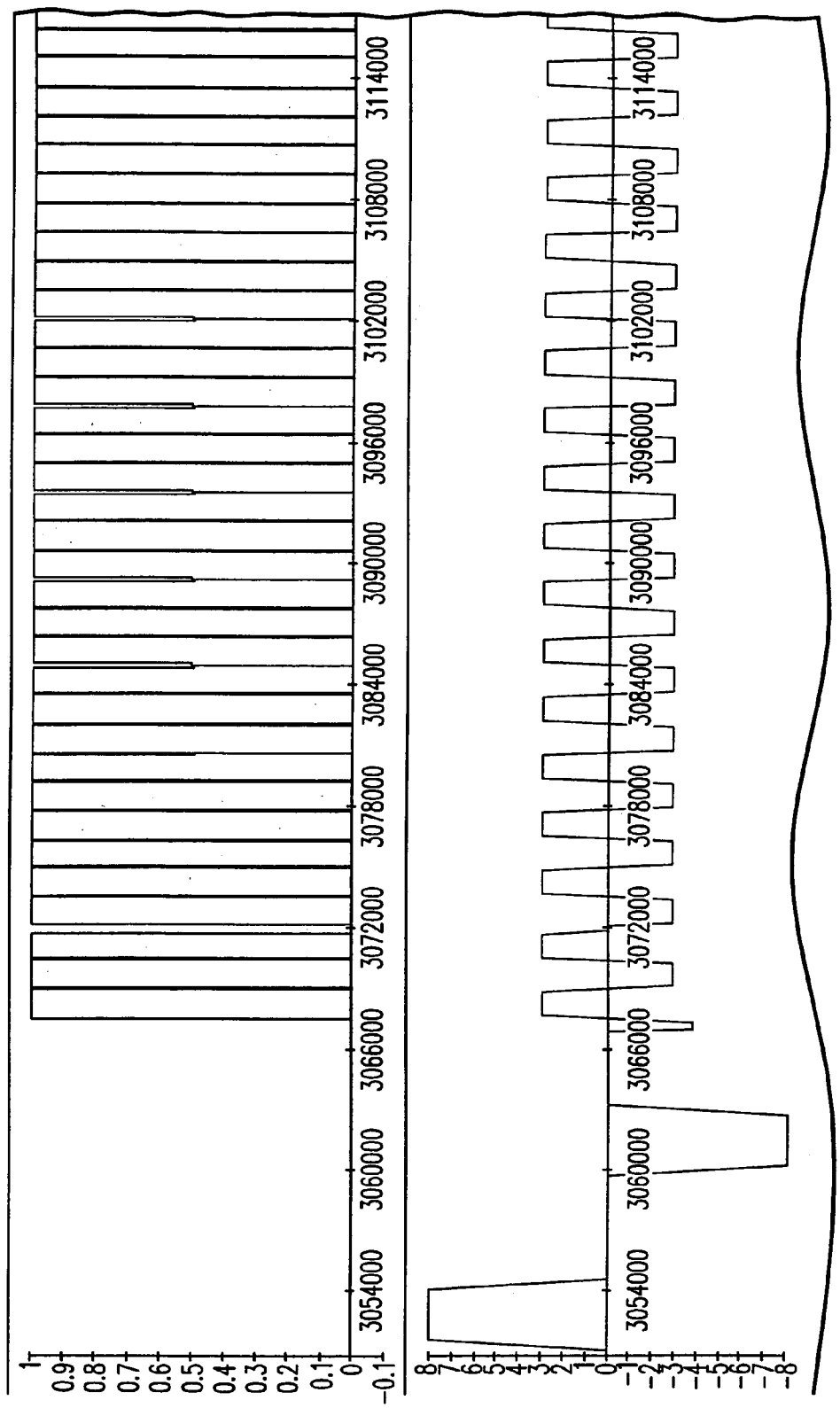
FIGS. 3a to 3f represent various component portions of the total GE-EPI pulse sequence.
Figure 3B:
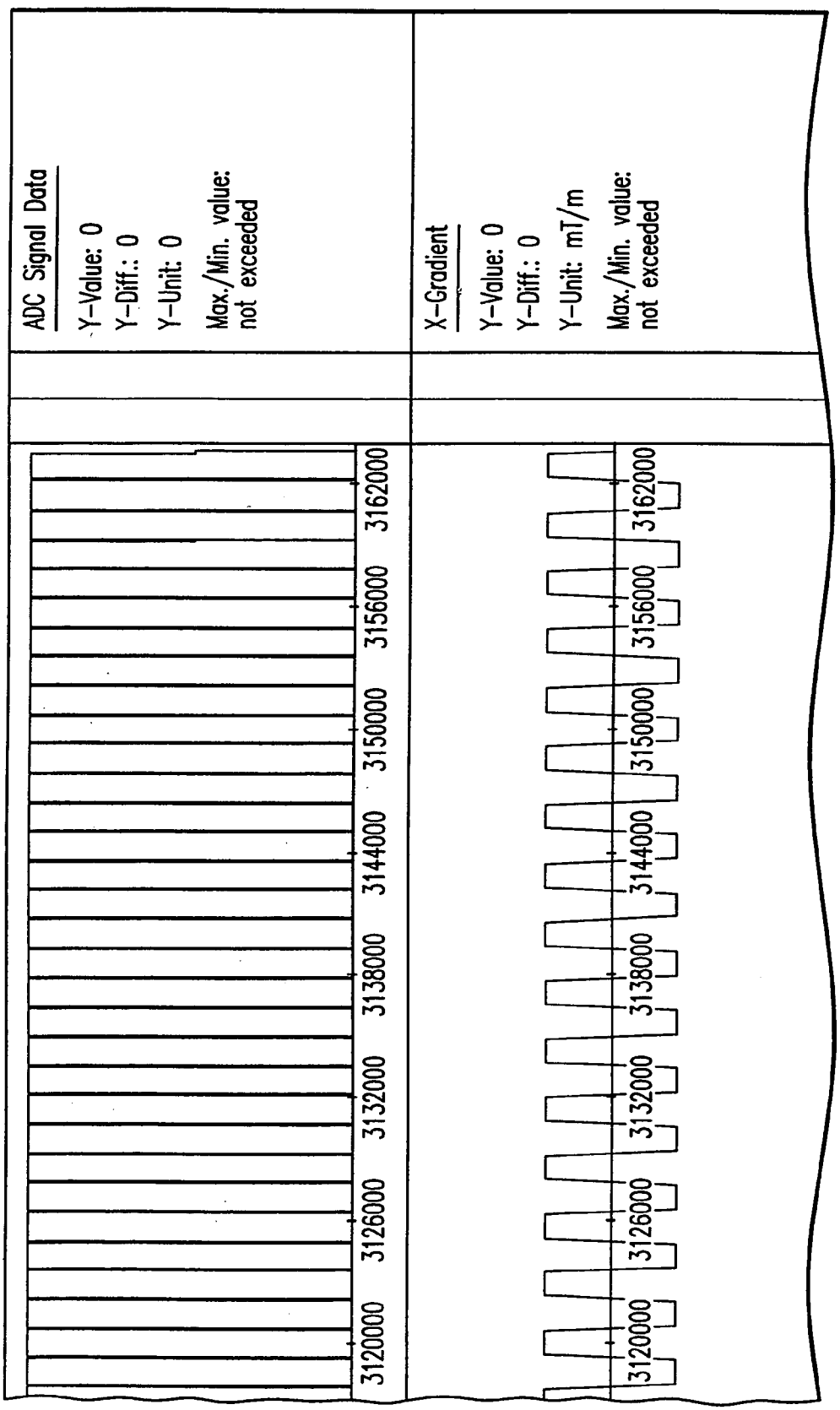
Figure 3C:
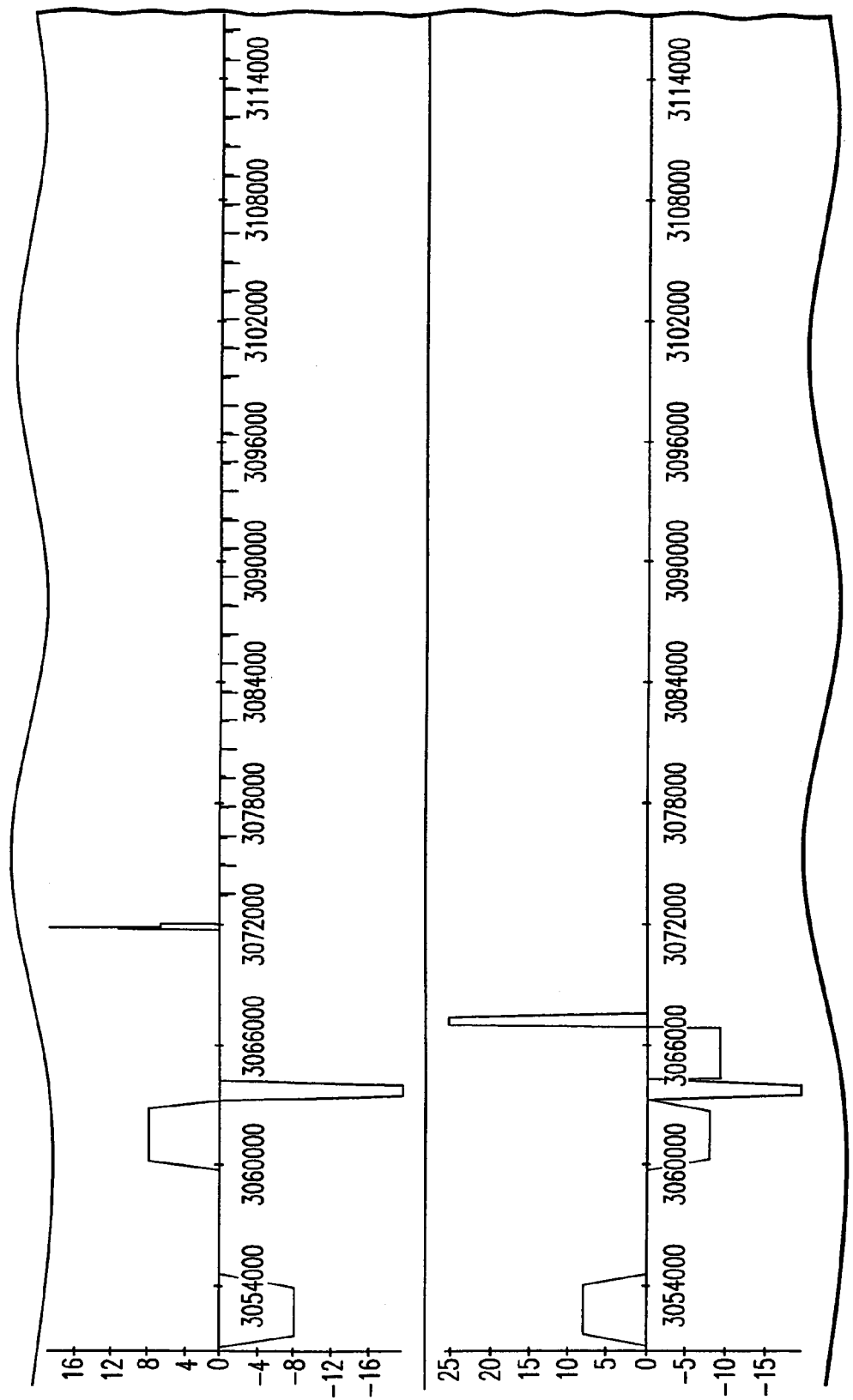
Figure 3D:
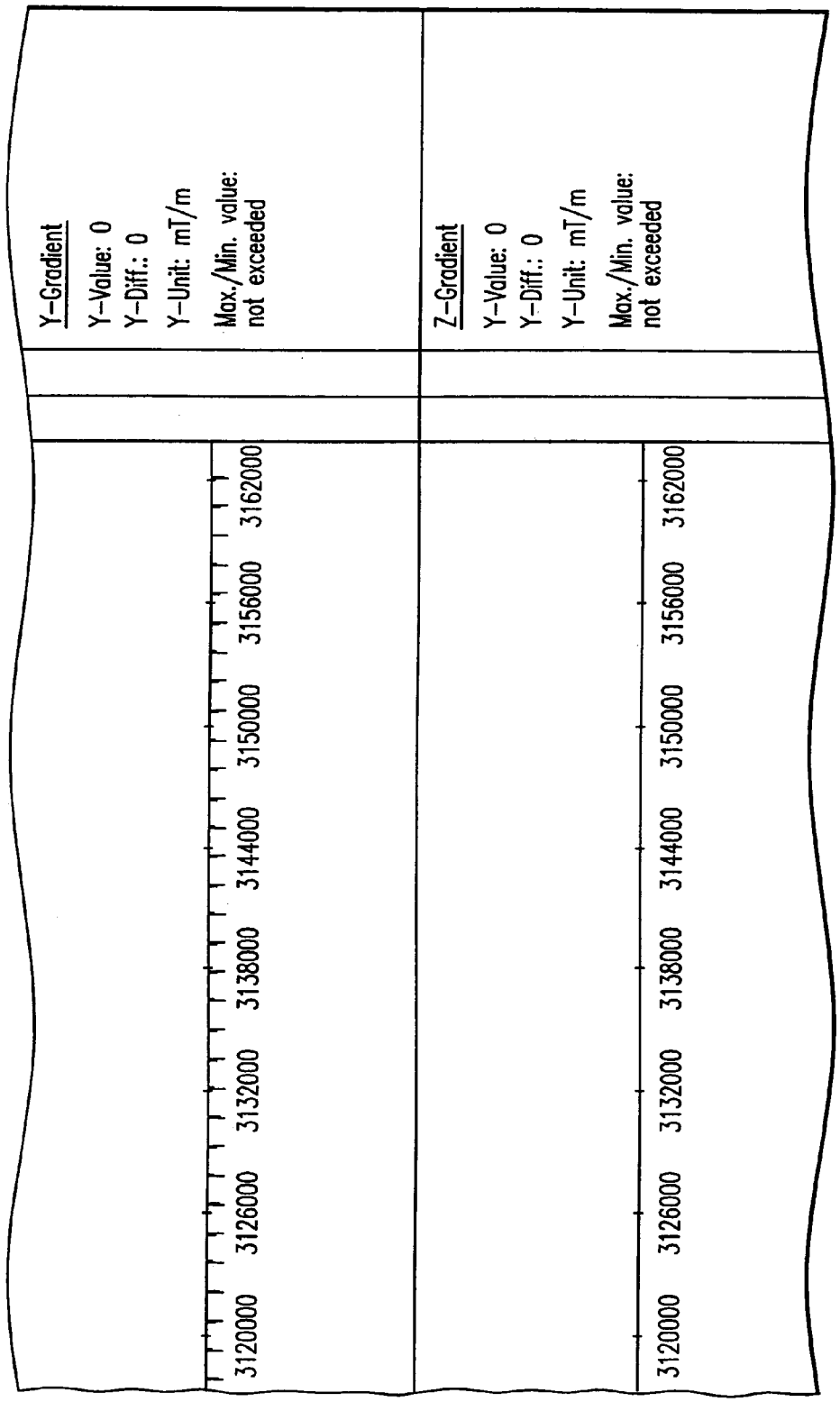
Figure 3E:
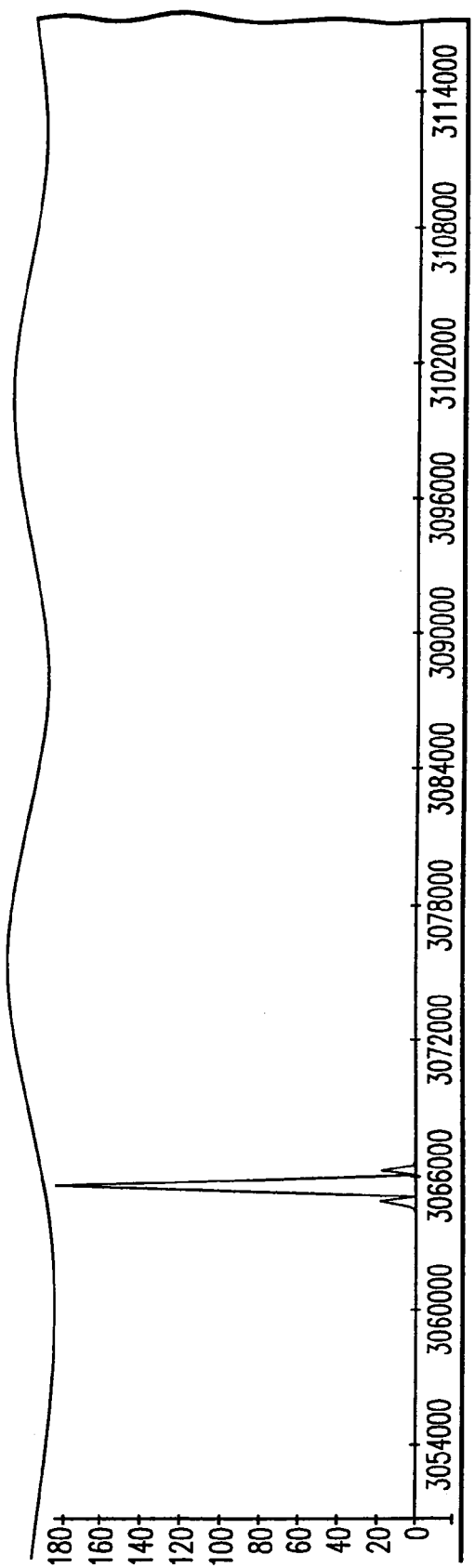
Figure 3F:
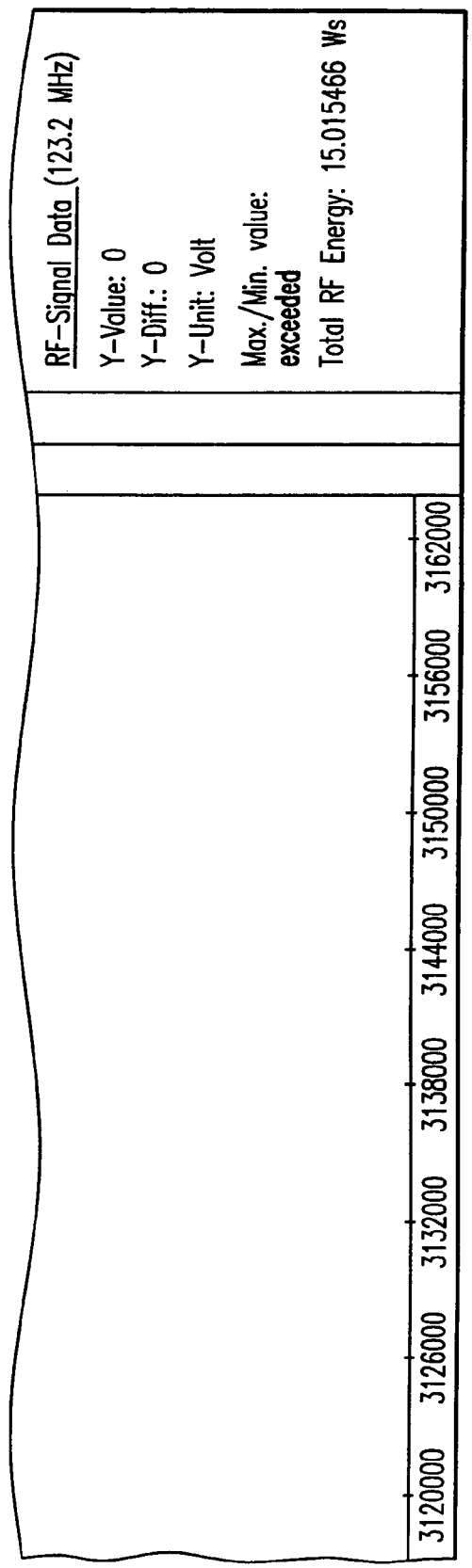
Figure 4:
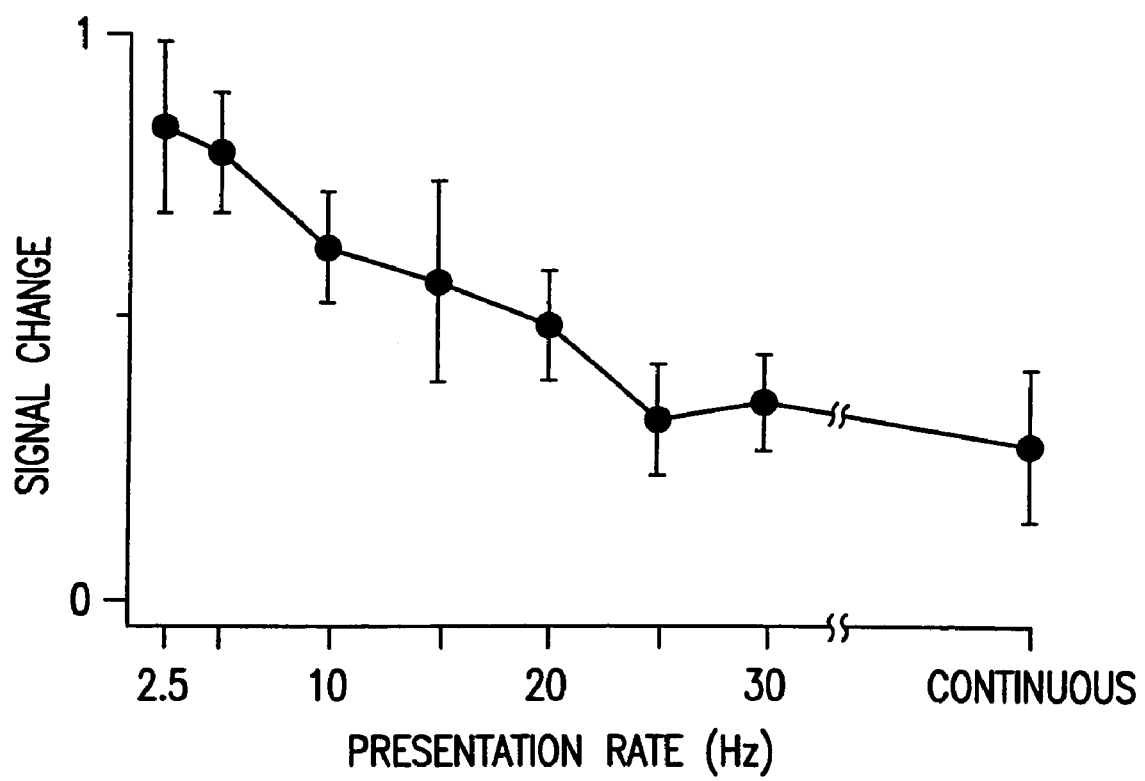
FIG. 4 is a graph demonstrating decrease in the BOLD response (Δ % signal change) within the human auditory cortex as a function of the presentation rate of an applied 1 kHz sine tone.

In this way, the acoustic noise spectrum of the background gradient noise is modified because the GR is responsible for creating a major portion of the background gradient noise generated via the inverting gradient magnetic field power source 40 energizing the magnetic field coils. In other words, the LINA-EPI pulse sequence in accordance with the present invention utilizes a read gradient consisting of multiple interrupted lobe clusters as shown in FIG. 6, instead of the conventional EPI read gradients that consist of a continuous, uninterrupted lobe train as shown in FIG. 1. The magnetic field coils of gradient coil assembly 12 energized to generate the GR shown in FIG. 6 are responsible for generating acoustic read gradient noise that is mainly composed of a high 500–2000 Hz component and a low 50–200 Hz component. Both of these noise components manifest a presentation rate (i.e., repetition rate or pulse rate) higher in frequency than the critical pulse rate 30–50 Hz, below which the human auditory system is particularly sensitive (Refer to FIG. 4).

The phase encoding gradient (GP) in accordance with the LINA-EPI pulse sequence of the present invention also has an interrupted and clustered character as shown in FIG. 6. The control unit 60 is programmed to generate the phase encoding gradient (GP) pulses, which consist solely of multiple clusters of blips separated by a short interval of about 0.2–2 ms. Each blip cluster includes 3–20 blips, and each blip cluster is separated from the preceding blip cluster by a 0.2 to 2 ms interval. The control unit 60 directs the power source 40 to energize certain magnetic field coils of gradient coil assembly 12 so as to generate the magnetic field of the phase encoding gradient, preferably oriented along the Y-axis, that consists of multiple clustered bursts with each cluster being separated from the preceding cluster by a short time interval of about 0.2 to 2 ms. The GP pulse determines the phase of the echoes that will be sampled during data acquisition. The resulting acoustic spectra generated by energized magnetic field coils of gradient coil assembly 12, in accordance with the phase encoding gradient, has components similar to those generated by the read gradient. However, the magnitude of the acoustic noise generated by the phase encoding gradient is negligible when compared to the magnitude of the acoustic noise generated by the read gradient.

The slice select gradient (GS) of the LINA-EPI pulse sequence of the present invention is shown in FIG. 6, and is switched on and off using relatively slow gradient ramps (i.e., greater than 2 ms) when compared to the relatively short gradient ramps utilized in the conventional GE-EPI sequence of FIG. 1. Control unit 60 directs the power source 40 to energize those magnetic field coils of gradient coil assembly 12 that provide a magnetic field pulse gradient for selective slice excitation so as to select the intended slice to be imaged, generally along the Z-axis. In accordance with the present invention, the use of very slow gradient ramps (See FIG. 6b) in generating the pulses of the GS results in the production of a minimal amount of gradient noise by this gradient axis. In fact, the resulting noise produced by the GS pulses is imperceptible (i.e., negligible) in the presence of noise produced by the read gradient and the phase encoding gradient. Those skilled in the art will recognize that the use of very slow gradient ramps is a technique used when composing "silent sequences." However, in accordance with the present invention, the application of slow gradient ramps is limited to the slice encoding gradient component of the LINA-EPI pulse sequence so as to have no appreciable effect on temporal resolution or required scanning time.

Additional gradients are required in the read direction (i.e., X-axis) and in the phase direction (i.e., Y-axis) for the purpose of dephasing. These additional gradients are ramping, and are added before the onset of the navigator echoes to the repetitive clusters of the read gradient and the phase encoding gradient as shown in FIG. 6a. The additional dephasing gradients are switched on and off using very slow gradient ramps (i.e., greater than 2 ms), as shown within the portion of the LINA-EPI pulse sequence that precedes the onset of the navigator echoes.

The control unit 60 provides the control signals that directs the RF transmission unit 20 to energize the RF coil 14 and generate an RF excitation pulse. The RF excitation pulse serves to irradiate the test subject TS to achieve a selected magnetic resonance manipulation. As shown in FIG. 6a, the RF excitation pulse is transmitted during the short period, or window, lasting about 0.2 to 2 ms when both the read gradient and the phase encoding gradient are zero.

The LINA-EPI sequence pattern for fMRI presented in FIG. 7 is a particular illustrative example of a pulse sequence in accordance with the present invention. The oscillating reading gradient (7 echoes with 850 us separation, having a echo frequency of approximately 600 Hz) is interrupted approximately every 7 ms (which corresponds to a cluster frequency of approximately 140 Hz) for approximately 1 ms, which results in a continuous gradient noise having 140 Hz and 600 Hz components. The selective RF pulse is sent during a 1 ms pause. The slowly ramped slice selection gradient, and the phase encoding gradient, are not acoustically detectable. Consequently, the LINA-EPI pulse sequence of FIG. 7 causes the MRI scanner to emit an acoustic gradient noise spectrum manifesting minimal power for frequencies below 140 Hz.

Figure 8A:
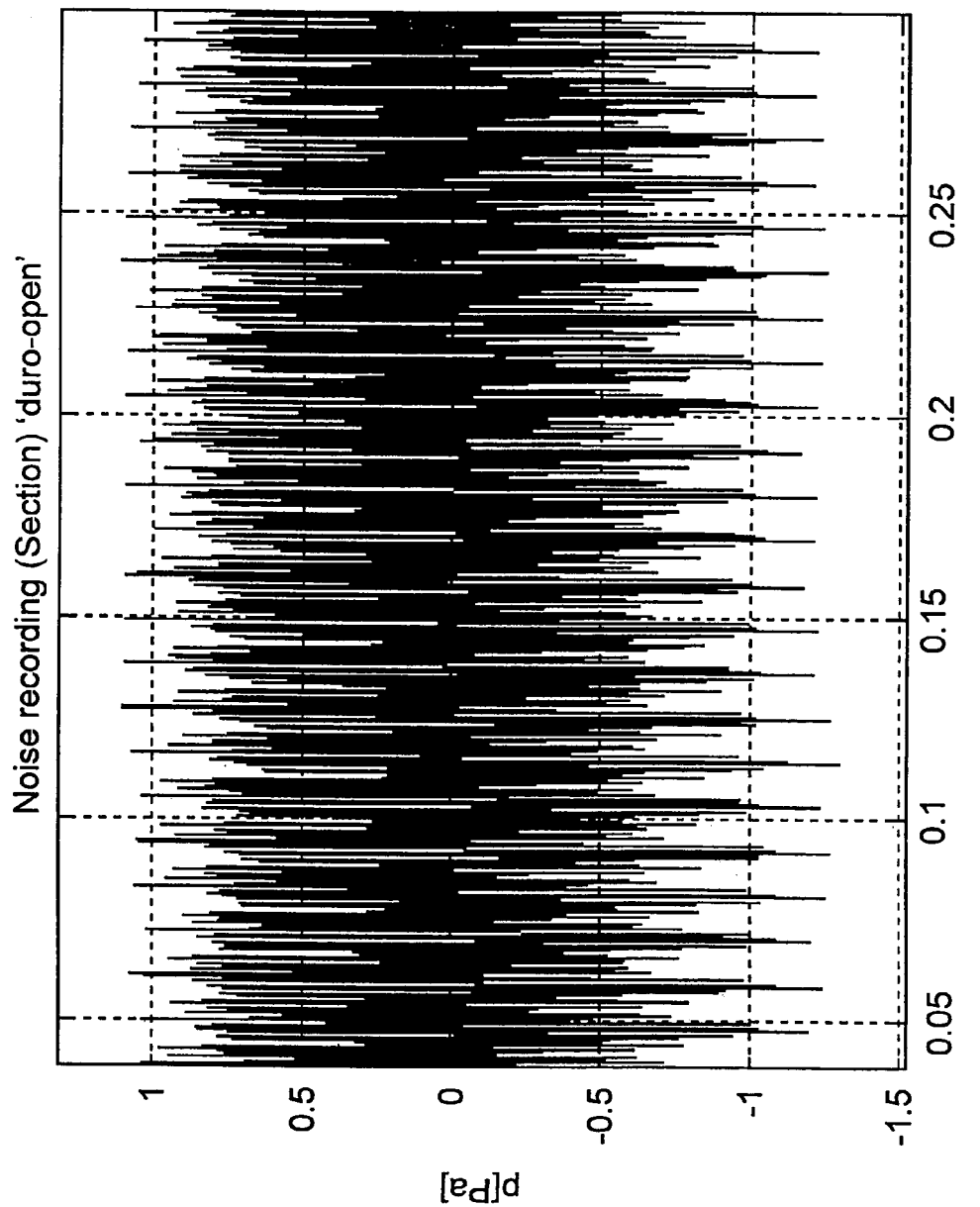
FIG. 8a is a graph of the measured acoustic noise of produced when using a LINA-EPI pulse sequence in accordance with the present invention.
Figure 8B:
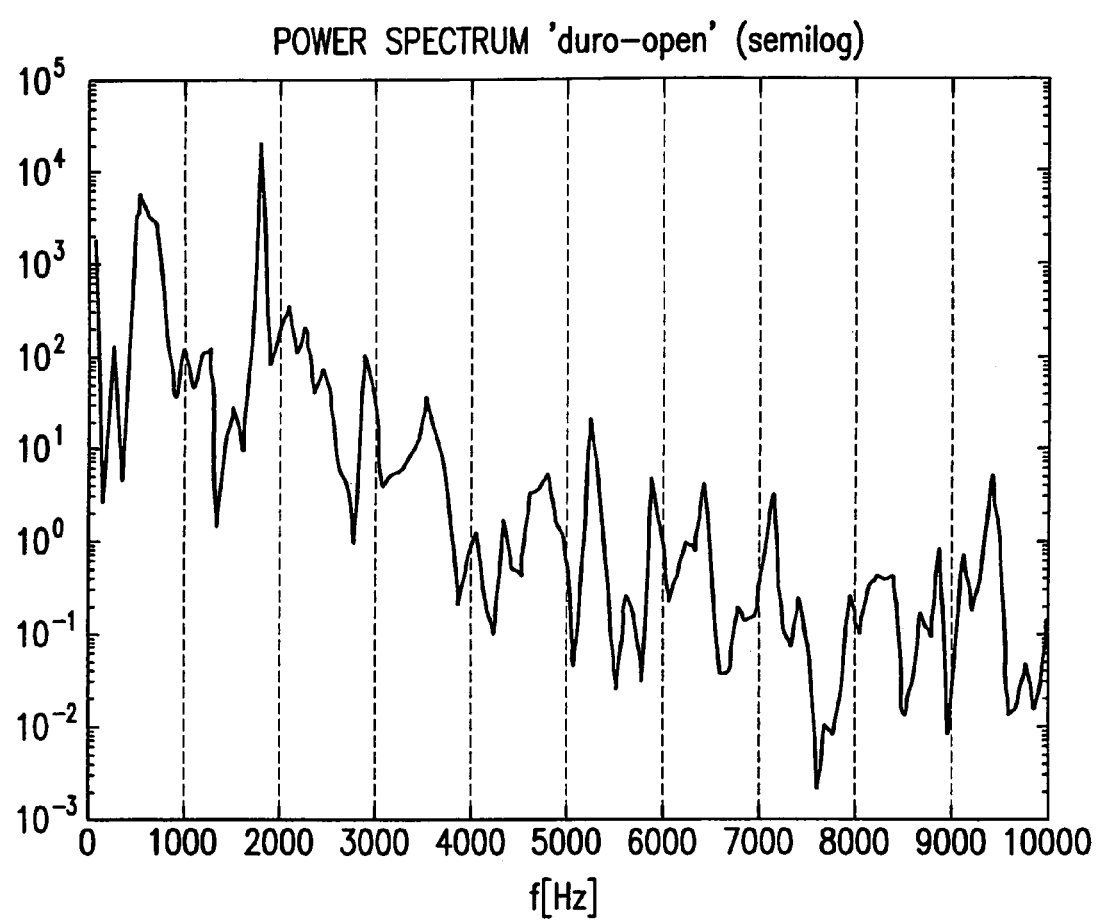
FIG. 8b is the power spectrum corresponding to the graph of FIG. 8a wherein the peak sound amplitude (SPL) is 96.3 dB(A), minimal sound amplitude (SPL) is 23.1 dB(A).

FIGS. 8a and 8b demonstrate the measured acoustic noise spectrum and corresponding power spectrum, respectively, when an MRI scan was performed using another LINA-EPI pulse sequence pattern in accordance with the present invention. In this LINA-EPI sequence embodiment, the GR (7 echoes with 850 us separation, having a echo frequency of approximately 600 Hz) was interrupted at a slower rate than in the embodiment of FIG. 7 so that the cluster frequency was about 110 Hz. The LINA-EPI pulse sequence embodiment corresponding to the data shown in FIGS. 8a and 8b results in continuous acoustic noise having 140 Hz and 600 Hz components.

As the two embodiments described above show, LINA-EPI magnetic field gradient pulse sequences in accordance with the present invention result in MRI scans that generate continuous acoustic noise having minimal, or negligible, acoustic frequency components below 30 Hz. Consequently, application of LINA-EPI pulse sequences of the present invention to fMRI scanning procedures should reduce the amount of confounding stimulation of the human auditory system in view of the data provided in FIG. 4 discussed above.

Evidence of Superiority:

Additional illustrative LINA-EPI pulse sequence embodiments in accordance with the present invention are described and their advantages over conventional EPI pulse sequences are characterized through comparative testing, the results of which are compiled below. In the present examples, the conventional EPI pulse sequence used for comparative testing is the GE-EPI sequence shown in FIG. 3.

Differences in Sound Quality

The difference in the sound quality between acoustic noise generated by a conventional MRI scanner operating with a conventional EPI pulse sequence and acoustic noise generated by the same MRI scanner operating with a LINA-EPI pulse sequence, in accordance with the present invention, is best appreciated by listening to the actual noises. The audio file entitled "conventional-EPI-sound.wav" is a sound recording of acoustic noise generated by a conventional Siemens MRI scanner scanning using the conventional GE-EPI pulse sequence shown in FIG. 3. The audio file entitled "LINA-EPI-sound.wav" is a sound recording of acoustic noise generated by the same type of conventional Siemens MRI scanner scanning using the LINA-EPI pulse sequence shown in FIG. 7.

Comparisons of these sound recordings demonstrates that acoustic noise generated by the MRI scanner while operating in accordance with the conventional EPI sequence exhibits banking, so the noise manifests a stuttering pattern and is not monotonous. On the other hand, the acoustic noise generated by the MRI scanner while operating in accordance the LINA-EPI sequence exhibits a continuous monotone. For the purpose of this disclosure, acoustic gradient noise exhibiting banking, such as demonstrated in the conventional-EPI-sound.wav file, will be referred to a "banked noise." On the other hand, acoustic gradient noise exhibiting a continuous monotone sound, such as demonstrated in the LINA-EPI-sound.wav file, will be referred to simply as "monotonous noise."

LINA-EPI Sequence of Example 1:

The LINA-EPI pulse sequence of Example 1, with reference to FIGS. 6a and 6b, includes the following sequence parameters: (a) a lobe B duration of 1.6 ms peak-to-peak for the GR (i.e., the separation of echo pairs is 1.6 ms, which corresponds to an echo spacing of 0.8 ms); (b) acquisition of 10 lobes of each cluster C; (c) separation interval A of 1.024 ms between clusters; (d) a total of 11 clusters generated for each image slice; (e) an echo time (TE) of 63 ms; a repetition time (TR) of 122 ms; (f) a matrix size of 64×64 with field-of-view of 180 mm×180 mm; and (g) a slice thickness of 4 mm. fMRI scanning was then performed on healthy human volunteers using this LINA-EPI pulse sequence.

First, BOLD activation of the auditory cortex of subjects exposed to banked noise generated during conventional EPI sequencing was compared with BOLD activation of the auditory cortex of the subjects when exposed to monotonous noise generated during LINA-EPI sequencing. As demonstrated in FIG. 9, the monotonous acoustic noise generated by a LINA-EPI pulse sequence induces significantly less of a BOLD effect on the auditory cortex (about 50% less BOLD signal), as shown by the curve with the open dots, than the banked acoustic noise generated by a conventional EPI pulse sequence, shown by the curve with the filled dots. In this experiment, acoustic gradient noise was recorded, and then presented via earphones to each subject. Functional scan data was measured using a "blocked acquisition scheme" consisting of short EPI acquisition blocks (duration: 1.53 seconds), and long, silent intervals (14 seconds).

The number N of test subjects was twelve (N=12). The presented time courses are fMRI signals averaged within the activated volume using a significance of p<0.05 (corrected for the number of pixels within the activated volume).

Second, BOLD activation of the auditory cortex of subjects exposed to an auditory test stimulus, in particular an external pulsed sine tone (1 kHz frequency, 5 Hz pulse rate), was tested to determine the confounding effect of banked noise generated during conventional EPI sequencing compared to the confounding effect of monotonous noise generated during LINA-EPI sequencing. As demonstrated in FIG. 10, scanning using a LINA-EPI pulse sequence induces significantly less of a confounding BOLD effect on the auditory cortex so that a two-fold higher response to the test stimulus is detected, as shown by the curve in green, than the fMRI response detected using a conventional EPI pulse sequence, shown by the curve in blue. In this experiment, acoustic gradient noise was recorded, and then presented via earphones to each subject. Furthermore, the signal time courses have been averaged within the activated volume across N=6 subjects.

Third, the auditory BOLD response to complex sounds, such as classical music, was tested with both conventional EPI and LINA-EPI pulse sequence MRI imaging. For this test, the acoustic stimulus was the first minute of track 6 of Antonio Vivaldi's "Le quattro stagione." As shown by the curve in green in FIG. 11, MRI scanning using the LINA-EPI pulse sequence resulted in a nearly doubled detection of the BOLD response induced by the complex test sound (Vivaldi's music) when compared to MRI scanning using the conventional EPI pulse sequence, as shown by the curve in blue. In other words, because there is less of a confounding BOLD effect on the auditory cortex exposed to monotonous noise, as opposed to banked noise, MRI scanning using a LINA-EPI pulse sequence to detect a functional response to a complex sound test stimulus is more sensitive than MRI scanning using a conventional EPI pulse sequence.

The following conclusions are supported by the results of the comparative testing between MRI scanning using the LINA-EPI pulse sequence of Example 1 and MRI scanning using a conventional EPI pulse sequence of FIG. 3: modification of acoustic gradient noise from banking noise to monotonous noise results in (1) a significantly reduced activation of the auditory system by acoustic noise (i.e., 50% BOLD signal reduction), (2) significantly reduced interference between auditory system activation by a simple auditory test tone and acoustic gradient noise, thereby improving detection of the BOLD effect induced by the simple auditory tone, and (3) significantly reduced interference between auditory system activation by a complex auditory test sound and acoustic gradient noise, thereby improving detection of the BOLD effect induced by the complex auditory sound.

Lastly, several general comparisons are made between MRI scanning preformed using LINA-EPI pulse sequences in accordance with the present invention to MRI scanning performed using a conventional EPI pulse sequence.

First, the periodic interruption of the otherwise continuous GR echo train results in (a) about a 10 percent longer data acquisition period, and (b) a discontinuous distribution of echo times on individual k-space lines. The lengthening of the data acquisition period leads to heightened picture distortion in poorly illuminated imaged regions, and the discontinuous distribution of echo times on the k-space lines can lead to ghosting artifacts similar to those seen in segmented EPI. However, for LINA-EPI pulse sequences in accordance with the present invention, both of these distorting image artifacts turn out to be minimal, and can be further reduced with corresponding sequence optimization. At equal TE, TR and flip angle, artifactual differences are hardly visible between test images acquired with LINA-EPI and conventional EPI. Thus, the picture quality obtained with MRI scanning performed with LINA-EPI pulse sequences is comparable to the picture quality obtainable using conventional EPI pulse sequences. However, in a phantom capture image, there are small ghosting artifacts that are visible in the outer layers of the image when a LINA-EPI sequence is used, which is not seen with conventional EPI sequences.

Second, the signal stability of conventional EPI scanning, and of LINA-EPI scanning, over 100 measurements was demonstrated on test subjects and phantom images. Both methods show a comparably high SNR over time from about 80 on test subject images and 400 on phantom images. Thus, signal stability for fMRI scans performed using a LINA-EPI pulse sequence in accordance with the present invention were comparable to the signal stability observed for fMRI scans performed using a conventional EPI sequence.

While the nuclear magnetic resonance imaging method of the present invention has been described as having a read gradient comprising multiple interrupted lobe clusters, the scope of the present invention is not limited to read gradients that include multiple interrupted lobe clusters. Other read gradient possibilities exist for generating monotone gradient noise in accordance with the present invention. For example, a continuously running read gradient may be used to generate monotone gradient noise when certain different RF excitation pulses are used. In this case, it is estimated that the monotone gradient noise produced would constitute a high frequency tone of about 1 KHz.

In other words, while certain illustrative embodiments of a LINA-EPI pulse sequence for generating monotonous gradient noise without banking, in accordance with the present invention, have been described, they are non-limiting examples. More generally, LINA-EPI pulse sequences in accordance with the present invention include rapid gradient pulse sequences that have a read gradient, an RF excitation pulse, a slice gradient, and a phase encoding gradient. When read gradients comprising multiple interrupted lobe clusters are employed, each lobe cluster of the read gradient includes about 1 to about 50 lobes (preferably 3 to 20 lobes), and each lobe cluster is separated from the next lobe cluster by a time interval of up to about 5 ms (preferably 0.2 to 2 ms). When read gradients comprising multiple lobe clusters are employed, the phase encoding gradient includes multiple interrupted blip clusters, wherein each blip cluster includes about 1 to about 50 blips (preferably 3 to 20 blips), and each blip cluster is separated from the next blip cluster by a time interval of up to about 5 ms (preferably 0.2 to 2 ms). At the same time, the slice gradient includes one or more pulses having slow gradient ramps, each gradient ramp lasting longer than at least 0.1 ms (but preferably longer than 2 ms) and the RF excitation pulse is transmitted during a window lasting up to about 5 ms (preferably 0.2 to 2 ms), and during this window both the read gradient and the phase gradient are zero.

Thus, while an MR imaging sequence in accordance with the present invention is similar, in certain respects (i.e., in terms of acquisition speed, $T_2^*$ sensitivity or BOLD sensitivity, signal-to-noise ratio, and spatial resolution), when compared to conventional EPI, image sequencing in accordance with the present invention produces monotone gradient noise instead of conventionally pulsed noise. Thus, MR imaging sequences that lead to the production of monotone gradient noise are referred to as low impact noise acquisition EPI, or LINA-EPI, to distinguish them from conventional EPI.

While the present invention has been described with reference to certain illustrative embodiments, one of ordinary skill in the art will recognize that additions, deletions, substitutions, modifications and improvements can be made while remaining within the spirit and scope of the present invention as defined by the appended claims.

What is claimed is:

1. A nuclear magnetic resonance imaging method comprising the steps of:
   generating a rapid gradient pulse sequence suitable for fMRI comprising a read gradient;
   generating substantially monotonous gradient acoustic noise substantially without banking; and
   imaging a test subject using the rapid gradient pulse sequence.

2. A nuclear magnetic resonance imaging method as recited in claim 1, wherein the read gradient is a continuously running read gradient.

3. A nuclear magnetic resonance imaging method as recited in claim 1, wherein the read gradient includes multiple interrupted lobe clusters.

4. A nuclear magnetic resonance imaging method as recited in claim 3, wherein the rapid gradient pulse sequence is a LIINA-EPI pulse sequence that includes an RF excitation pulse, a slice gradient, and a phase encoding gradient; wherein each lobe cluster of the read gradient includes about 1 to about 50 lobes, and a first lobe cluster is separated from a second lobe cluster by a time interval of about 0.0 ms to about 5 ms; the phase encoding gradient includes multiple interrupted blip clusters, wherein each blip cluster includes about 1 to about 50 blips, and a first blip cluster is separated from a second blip cluster by a time interval of about 0.0 ms to about 5 ms; the slice gradient includes one or more pulses having slow gradient ramps, each gradient ramp lasting longer than at least 0.1 ms; and the RF excitation pulse is transmitted during a window lasting about 1 ms to about 5 ms, and during this window both the read gradient and the phase gradient are zero.

5. A nuclear magnetic resonance imaging method as recited in claim 3, wherein the rapid gradient pulse sequence is a LINA-EPI pulse sequence that includes an RF excitation pulse, a slice gradient, and a phase encoding gradient; wherein each lobe cluster of the read gradient includes about 3 to about 20 lobes, and a first lobe cluster is separated from a second lobe cluster by a time interval of about 0.2 ms to about 2 ms; the phase encoding gradient includes multiple interrupted blip clusters, wherein each blip cluster includes about 3 to about 20 blips, and a first blip cluster is separated from a second blip cluster by a time interval of about 0.2 ms to about 2 ms; the slice gradient includes one or more pulses having slow gradient ramps, each gradient ramp lasting longer than about 2 ms; and the RF excitation pulse is transmitted during a window lasting about 0.2 ms to about 2 ms, and during this window both the read gradient and the phase gradient are zero.

6. A nuclear magnetic resonance imaging method as recited in claim 1, wherein the rapid gradient pulse sequence is T2 weighted.

7. A nuclear magnetic resonance imaging method as recited in claim 1, wherein the rapid gradient pulse sequence is T2* weighted.

8. A nuclear magnetic resonance imaging method that utilizes a LINA-EPI gradient pulse sequence, comprising the steps of:

generating a LINA-EPI gradient pulse sequence comprising a read gradient, a RF excitation pulse, a slice gradient, and a phase encoding gradient;
   generating substantially monotonous gradient acoustic noise as a result of generating the LINA-EPI gradient pulse sequence, wherein the substantially monotonous gradient acoustic noise is substantially without banking and minimizes confounding BOLD effects during imaging; and
   imaging a test subject using the LINA-EPI gradient pulse sequence.

9. A nuclear magnetic resonance imaging method as recited in claim 8, wherein the read gradient includes multiple interrupted lobe clusters.

10. A nuclear magnetic resonance imaging method as recited in claim 9, wherein each lobe cluster includes 3 to 20 lobes, and a first lobe cluster is separated from a second lobe cluster by a time interval of about 0.2 to 2 ms.

11. A nuclear magnetic resonance imaging method as recited in claim 9, wherein each lobe cluster includes 7 lobes, and a first lobe cluster is separated from a second lobe cluster by a time interval of about 0.850 ms.

12. A nuclear magnetic resonance imaging method as recited in claim 9, wherein the phase encoding gradient includes multiple interrupted blip clusters.

13. A nuclear magnetic resonance imaging method as recited in claim 12, wherein each blip cluster includes 3 to 20 blips, and a first blip cluster is separated from a second blip cluster by a time interval of about 0.2 to 2 ms.

14. A nuclear magnetic resonance imaging method as recited in claim 12, wherein the slice gradient includes one or more pulses having slow gradient ramps, each gradient ramp lasting longer than 2 ms.

15. A nuclear magnetic resonance imaging method as recited in claim 14, wherein the RF excitation pulse is transmitted during a window lasting about 0.2 to 2 ms, and during this window both the read gradient and the phase gradient are zero.

16. A nuclear magnetic imaging apparatus programmed to perform LINA-EPI gradient pulse sequencing, the apparatus comprising:
   (a) a magnet assembly including:
      i. a magnet for generating a uniform static magnetic field along a z-axis;
      ii. a gradient magnetic field coil assembly for generating a gradient magnetic field in a measuring space;
      iii. an RF coil for generating an RF magnetic field in the measuring space; and
      iv. an RF probe envelope disposed to detect MR signals generated by a test subject in the measuring space; and
   (b) an imaging processing assembly including:
      i. a gradient magnetic field power source operably connected to energize the gradient magnetic filed coil assembly;
      ii. an RF transmission unit operably connected to energize the RE coil;
      iii. a signal detection unit operably connected to receive an MR signal from the RE probe envelope; and
      iv. a control unit operably connected to the gradient magnetic field power source, the RF transmission unit, and the signal detection unit, wherein the control unit is programmed to control the gradient magnetic field power source and the RF transmission unit so as to generate a LINA-EPI gradient pulse sequence using the gradient magnetic field coil assembly and the RF coil, wherein the LINA-EPI gradient pulse sequence includes a read gradient, a RF excitation pulse, a slice gradient, and a phase encoding gradient, wherein the read gradient read includes multiple interrupted lobe clusters, with each lobe cluster including 3 to 20 lobes, wherein a first lobe cluster is separated from a second lobe cluster by a time interval of about 0.2 to 2 ms, and the apparatus generates substantially monotonous gradient noise as a result of generating the LINA-EPI gradient pulse sequence, wherein the substantially monotonous gradient noise is substantially without banking.

17. An apparatus as recited in claim 16, wherein the phase encoding gradient includes multiple interrupted blip clusters, with each blip cluster including 3 to 20 blips, wherein a first blip cluster is separated from a second blip cluster by a time interval of about 0.2 to 2 ms; the slice gradient includes one or more pulses having slow gradient ramps, each gradient ramp lasting longer than 2 ms; and the RF excitation pulse is transmitted during a window lasting about 0.2 to 2 ms, and during this window both the read gradient and the phase gradient are zero.

18. A nuclear magnetic resonance imaging method that utilizes a LINA-EPI gradient pulse sequence, comprising the steps of:
generating a LINA-EPI gradient pulse sequence comprising a read gradient, a RE excitation pulse, a slice gradient, and a phase encoding gradient;
generating substantially monotonous gradient acoustic noise as a result of generating the LINA-EPI gradient pulse sequence, wherein the substantially monotonous gradient acoustic noise substantially corresponds to sound file LINA-EPI-sound.wav; and
imaging a test subject using the LINA-EPI gradient pulse sequence.

19. A nuclear magnetic resonance imaging method comprising the steps of:
generating a rapid gradient pulse sequence suitable for fMRI comprising a read gradient, wherein the read gradient includes multiple interrupted lobe clusters, and each lobe cluster includes 3 to 20 lobes, and a first lobe cluster is separated from a second lobe cluster by a time interval of about 0.2 to 2 ms;
generating substantially monotonous gradient noise substantially without banking; and
imaging a test subject using the rapid gradient pulse sequence.

20. A nuclear magnetic resonance imaging method as recited in claim 19 wherein the rapid gradient pulse sequence generated is a LINA-EPI pulse sequence that also includes a RF excitation pulse, a slice gradient, and a phase encoding gradient.

21. A nuclear magnetic resonance imaging method as recited in claim 20, wherein the slice gradient includes one or more pulses having slow gradient ramps, each gradient ramp lasting longer than 2 ms.

22. A nuclear magnetic resonance imaging method as recited in claim 20, wherein the RF excitation pulse is transmitted during a window lasting about 0.2 to 2 ms, and during this window both the read gradient and the phase gradient are zero.

23. A nuclear magnetic resonance imaging method as recited in claim 20, wherein the phase encoding gradient includes multiple interrupted blip clusters.

24. A nuclear magnetic resonance imaging method as recited in claim 23, wherein each blip cluster includes 3 to 20 blips, and a first blip cluster is separated from a second blip cluster by a time interval of about 0.2 to 2 ms.

* * * * *